(12) United States Patent
Fujisawa et al.

(10) Patent No.: US 6,421,261 B1
(45) Date of Patent: *Jul. 16, 2002

(54) POWER SUPPLY APPARATUS WITH UNIDIRECTIONAL UNITS

(75) Inventors: Teruhiko Fujisawa; Hiroshi Yabe, both of Shiojiri; Osamu Shinkawa, Suwa; Tadao Kadowaki, Chino, all of (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/101,461

(22) PCT Filed: Nov. 11, 1997

(86) PCT No.: PCT/JP97/04109

§ 371 (c)(1),
(2), (4) Date: Jan. 26, 1999

(87) PCT Pub. No.: WO98/21815

PCT Pub. Date: May 22, 1998

(30) Foreign Application Priority Data

Nov. 13, 1996 (JP) ............................................. 8-302209

(51) Int. Cl.[7] ............................................. H02M 7/217
(52) U.S. Cl. ....................................................... 363/127
(58) Field of Search ........................... 363/127, 81, 84, 363/44, 125

(56) References Cited

U.S. PATENT DOCUMENTS

| 4,139,880 A | 2/1979 | Ulmer et al. |
| 4,417,164 A | 11/1983 | Edlund |
| 4,507,525 A | 3/1985 | Siligoni et al. |
| 4,519,024 A | * 5/1985 | Federico et al. ............ 363/127 |
| 4,535,203 A | 8/1985 | Jenkins et al. |
| 4,727,308 A | 2/1988 | Huljak et al. |
| 4,777,580 A | 10/1988 | Bingham |
| 5,077,486 A | 12/1991 | Marson et al. |
| 5,457,624 A | 10/1995 | Hastings |
| 5,506,527 A | 4/1996 | Rudolph et al. |

(List continued on next page.)

FOREIGN PATENT DOCUMENTS

| DE | 151 247 | 8/1981 |
| DE | 3727170 A1 | 2/1989 |
| EP | 07007955 | 1/1995 |
| EP | 08223906 | 8/1996 |
| EP | 08275508 | 10/1996 |

(List continued on next page.)

*Primary Examiner*—Adolf Deneke Berhane
(74) *Attorney, Agent, or Firm*—Stroock & Stroock & Lavan LLP

(57) ABSTRACT

A power supply apparatus employs a unidirectional unit equipped with a diode, a bypass switch connected in parallel to the diode, and a controller which turns the bypass switch ON when a forward voltage appears in the diode in order to rectify or prevent the backflow of the power from a power generating unit built in portable electronic equipment of an arm-worn type or the like; it is able to eliminate almost all loss caused by the forward voltage at the time of power supply. The electromotive force of the power generating unit incorporated in arm-worn type electronic equipment ranges from almost the same level to about a few times the level of the forward voltage; hence, the use of the unidirectional unit enables rectifying efficiency to be markedly improved.

23 Claims, 12 Drawing Sheets

U.S. PATENT DOCUMENTS

| | | |
|---|---|---|
| 5,510,972 A | 4/1996 | Wong |
| 5,523,940 A | 6/1996 | Wymelenberg |
| 5,528,482 A | 6/1996 | Rozman |
| 5,534,769 A | 7/1996 | Ishii |
| 5,540,729 A | 7/1996 | Weijand |
| 5,636,116 A * | 6/1997 | Milavec et al. ............... 363/89 |
| 5,663,877 A * | 9/1997 | Dittli et al. ................ 363/127 |
| 5,719,755 A * | 2/1998 | Usui ........................... 363/19 |
| 5,729,120 A * | 3/1998 | Stich et al. ................ 323/237 |
| 5,870,299 A * | 2/1999 | Rozman .................... 363/127 |
| 5,881,027 A | 3/1999 | Schafroth |

FOREIGN PATENT DOCUMENTS

| | | |
|---|---|---|
| EP | 0848842 B1 | 6/1998 |
| JP | 54-82039 | 6/1979 |
| JP | 63-1169569 | 7/1988 |
| WO | WO 85/01161 | 3/1985 |
| WO | WO 96/01003 | 1/1996 |
| WO | WO 97/24795 | 7/1997 |

* cited by examiner

POWER SUPPLY APPARATUS WITH UNIDIRECTIONAL UNITS

FIELD OF THE INVENTION

The present invention relates to a power supply apparatus which can be incorporated in arm-worn type or other type of portable electronic equipment and which is provided with a power generating device of such a type as the one that is capable of converting the kinetic energy of a human body into alternating current by making use of the motion of a rotary weight.

RELATED ART

Portable electronic equipment has been devised and put to practical use which makes it possible to obviate the need for replacing a battery or to eliminate the battery itself by incorporating a power generating device in small electronic equipment suited for carrying such as a wristwatch device. FIG. 11 shows the schematic configuration of a wristwatch device 10 incorporating a power generating unit 1 as an example. The portable electronic equipment (wristwatch device) 10 is provided with a rotary weight 13 which swings in the case of the wristwatch device, a wheel device 11 which transmits the rotary motion of the rotary weight 13 to an electromagnetic power generator, and a rotor 14 and a stator 15 making up the electromagnetic power generator 12; when the rotor 14 which has been magnetized to have two poles rotates, an electromotive force is generated in an output coil 16 of the stator 15, and an AC output can be taken out. Further, a power supply apparatus 20 of the portable electronic equipment is equipped with a rectifier circuit 24 which rectifies the alternating current output from the power generating unit 1 and supplies it to a large-capacity capacitor 5 and a processing unit 9; connected to the output side thereof are the large-capacity capacitor 5, which serves as a charging unit, and the processing unit 9. Hence, the processing unit 9 connected to the power supply apparatus 20 is able to operate a mounted timing function 7, etc. by the power of the power generating unit 1 or the power that the large-capacity capacitor 5 has discharged. Therefore, the portable electronic equipment is able to continuously operate the processing unit 9 even in the absence of a battery, thus implementing electronic equipment that permits the use of the processing unit at any place whenever required and that is also capable of solving the problems involved in discarding batteries.

In the electronic equipment shown in FIG. 11, since the power supplied from the built-in power generating unit 1 is of alternating current, it is rectified through the rectifier circuit 24 of the power supply apparatus 20 before it is charged in the large-capacity capacitor 5, and it turns into the operating power of the processing unit 9 equipped with an IC, etc. The power supply apparatus 20 shown in FIG. 11 employs the rectifier circuit 24 which temporarily charges the power, which has been half-wave rectified using two diodes 25 and 26, in an auxiliary capacitor 27 to perform boosting and rectification. For these diodes 25 and 26, silicon diodes are employed; as shown in FIG. 12, they have a forward voltage Vf of about 0.5 V to about 0.6 V with respect to a forward current If. Hence, power W1 obtained by rectifying power W0 supplied from the power generating unit 1 through the rectifier circuit 24 will be as shown below because there is a loss attributable to the forward voltage Vf of the diodes making up the rectifier circuit 24:

$$W1 = \eta c \times W0 \quad (1)$$

$$\eta c = V1/(V1 + 2 \times Vf) \quad (2)$$

where ηc denotes the rectifying efficiency at the time of charging, and V1 indicates the output voltage from the rectifier circuit and it corresponds to the charging voltage of the large-capacity capacitor 5 in the circuit shown in FIG. 11

Regarding the operating voltage of the processing unit 9 of the portable electronic equipment such as a wristwatch device, ICs or the like are increasingly driven at lower voltage to decrease power consumption; the processing unit may be started, for example, at about 0.9 V to about 1.0 V. Hence, the voltage of the large-capacity capacitor 5 is set to about 1.5 V to about 2 V; when the forward voltage Vf of about 0.5 V to about 0.6 V is considered, the rectifying efficiency ηc undesirably takes a value of approximately 0.6. Therefore, it is desirable that the forward voltage Vf is low in order to improve the rectifying efficiency ηc.

Further, as the power generating unit which can be built in the portable electronic equipment, there are, for example, a device which employs a rotary weight to catch the movement of a human body or the like and rotates a rotor so as to convert it to AC power, a device which employs a spiral spring to accumulate energy and converts it to AC power, a device which vibrates a piezoelectric element by the movement of a human body or the like in order to obtain AC power, and a device which employs a thermoelectric element or a solar battery to obtain DC power. Among these devices, in the power generating units which provide AC power, the kinetic energy obtained for power generation from the movement of a human body or the like is small, and the electromotive force is also small because the power generator itself is extremely miniaturized to build it in portable electric equipment; and further, the electromotive force greatly varies depending on the movement of a human body or the like and power, therefore, is not always obtained. Thus, the input voltage of the rectifier circuit is low and varies at a voltage in the vicinity of the forward voltage Vf; it reaches only a few times as high as the forward voltage Vf at the maximum. This means that the power feeding efficiency is markedly improved by lowering the forward voltage Vf.

In a power supply apparatus using a power generating unit such as a solar battery which generates DC power, the electromotive force also varies greatly depending on illuminance or the like. Hence, it is possible to effectively use the power, which has been generated, by lowering the forward voltage Vf of a backflow preventing diode even if the illuminance is low and the electromotive force is small. Thus, it is a significant challenge to lower the forward voltage Vf used in the supply circuit in order to effectively use the power supplied from the power generating unit which can be incorporated in portable electronic equipment for which the development is being pursued in recent years.

It is, therefore, an object of the present invention to provide a power supply apparatus with high power feeding efficiency, which power supply apparatus employs a unidirectional unit capable of lowering the forward voltage Vf in place of the diodes to markedly improve the rectifying efficiency ηc of the power supply apparatus for portable electronic equipment. And, it is another object of the invention to provide portable electronic equipment which can be used at any place whenever necessary without the need for replacing a battery by providing itself with the power generating unit with high efficiency and a processing unit.

DISCLOSURE OF THE INVENTION

To these ends, in a power supply apparatus which can be built in portable electronic equipment in accordance with the present invention, a unidirectional unit equipped with a diode, a bypass switch connected in parallel to the diode, and a controller which turns ON the bypass switch when a forward voltage appears in the diode is employed for the supply unit that supplies power from a power generating unit to a charging device or a processing unit. In the unidirectional unit, if current flows in the forward direction of the diode and a forward voltage appears, then the bypass switch is turned ON, so that the loss caused by the forward voltage can be prevented. Moreover, if the flowing direction of current is opposite from that of the diode, then a voltage of an opposite polarity from the forward voltage appears; therefore, the bypass switch is not turned ON and backflow can be prevented by the diode.

As a popular unidirectional unit mentioned above, there is a field-effect type transistor; the field-effect type transistor functions as the bypass switch; and a parasitic diode of the bypass switch functions as the diode.

When a power generating unit such as a solar battery employed for a wristwatch device or a power generating system having a rotary weight is used which catches the energy around a user of such a device to generate power, it is less likely that the power generating unit continuously works. It is therefore desirable to make an arrangement so that control may be conducted at a voltage that is higher than the voltage supplied from the large-capacity capacitor which has been charged or the output voltage of the power generating unit which has been stepped up by a booster circuit. By enabling the control at a voltage higher than the output voltage of the power generating unit, it becomes possible to quickly and securely perform switching operation even in the early stage or the ending stage of power generation when the output voltage is low, thus permitting even higher rectifying efficiency.

In such a unidirectional unit, turning the bypass switch ON causes the forward voltage to drop; hence, it is desirable to detect the direction of current in a different method to turn the bypass switch OFF. For instance, the presence of the forward voltage can be detected (sampled) so as to determine the direction of current by the controller first turning the bypass switch ON, then turning the bypass switch OFF after a predetermined time has elapsed. Hence, the presence of the forward voltage is detected periodically, and if the forward voltage is present, then the bypass switch is turned ON again, thus making it possible to decrease the loss of the forward voltage and also to prevent the backflow of current.

It is also possible to detect the direction of current by providing the controller with a comparing means for comparing the voltages at both ends of the diode so as to detect a drop in voltage through the bypass switch while the bypass switch is ON. Further, it is also possible to connect a resistor of an extremely small resistance value in series to the bypass switch in order to cause a voltage drop which can be detected by the comparator. Thus, the adoption of the unidirectional unit which controls the bypass switch depending on whether the forward voltage has been generated in the diode makes it possible to control the unidirectional unit according to the power generating state of the power generating unit without increasing the interfaces with the power generating device. Accordingly, the power generating unit itself no longer requires a coil or the like for detecting an electromotive force, enabling the control for obviating the loss attributable to the forward voltage to be achieved without complicating the configuration of the power generating unit and without increasing the interfaces with the power generating unit.

Further, in order to enable the unidirectional unit to display its performance in a state where no power for controlling the bypass switch is available, it is preferable to adopt an enhancement type field-effect transistor as the bypass switch. The use of the enhancement type makes it possible to fulfill the function of the unidirectional unit to prevent backflow by employing the diode since the bypass switch is turned OFF when no gate voltage is applied.

When AC power is supplied from the power generating unit, the AC power is rectified through the supplying section of the power supply apparatus; therefore, the loss attributable to the forward voltage of the diode can be reduced by using such a unidirectional unit. In particular, the electromotive force of the power generating unit which can be incorporated in portable electronic equipment is small and close to the forward voltage of the diode, so that the rectifying efficiency can be considerably improved, making it possible to provide a power supply apparatus with higher power feeding efficiency.

When performing full-wave rectification in the supply section, four unidirectional units may be used in place of the diode; for first and second input terminals connected to the power generating unit and first and second output terminals connected to the charging unit or the processing unit, first and second unidirectional units may be connected in parallel between the first and second input terminals and the first output terminal, and first and second field-effect transistors may be connected in parallel between the first and second input terminals and the second output terminal. The first conductive field-effect transistors are adopted for the first and second unidirectional units. The first and second field-effect transistors are of the second conductive type; the voltage of the second input terminal is applied to the gate input of the first field-effect transistor, while the voltage of the first input terminal is applied to the gate input of the second field-effect transistor. This causes both the unidirectional units and the first and second field-effect transistors to turn ON/OFF according to the voltage changes at the first and second input terminals, so that the loss due to the forward voltage is eliminated, leading to markedly improved power feeding efficiency.

The timing accuracy of turning the field-effect transistors ON can be improved by connecting driving elements such as inverters to the gate inputs of the second conductive type first and second field-effect transistors. It is also possible to provide a three-input comparator for comparing the voltages at the first and second input terminals with the voltage of the first output terminal as the controller of the first and second unidirectional units so as to enable the respective unidirectional units to determine the forward voltage at the same time, thus making it possible to reduce the total number of the comparators. This permits reduction in the power consumption of the semiconductor device which implements a power supplying circuit. Moreover, since the circuit is simplified, the area of the semiconductor device is reduced with resultant lower cost.

Further, also in the case of the power supply apparatus which has a power generating unit for supplying DC power, the adoption of the unidirectional units mentioned above for preventing backflow permits a reduction in the loss attributable to the forward voltage of diodes. More specifically, the use of the foregoing unidirectional units permits the prevention of the loss due to the forward voltage of the diodes at the time of power generation. In addition, the backflow to the power generator can be also prevented when no power is being generated or the electromotive force becomes lower than the voltage of the charging device.

Thus, the power supply apparatus in accordance with the present invention can be built in portable electronic equipment such as arm-worn type electronic equipment and it has a power generating unit which employs an electromagnetic power generator or a piezoelectric element or the like to output AC power, or a power generating unit such as a solar battery or a thermoelectric device or the like which outputs DC power; it is able to reduce the loss of the power from these power generating units when supplying the power to the charging unit or the processing unit. These power generating units are portable and capable of catching the movement or vibration of the body of a user thereof to generate power or converting discontinuous energy such as sunlight or temperature difference in the natural world into electric energy; it is not, however, capable of continuously providing power, and the electromotive force or the current density is low. Hence, the power supply apparatus in accordance with the present invention prevents the loss attributable to the forward voltage of the diode which nearly corresponds to the electromotive force of the power generating unit when performing rectification, or it prevents backflow in supplying power to the charging unit or the processing unit, thus making it extremely useful as a power supply apparatus for portable electronic equipment. Thus, the use of the power supply apparatus in accordance with the present invention makes it possible to provide full-fledged portable electric equipment such as a arm-worn type equipped with a processing device having a timing function, the electric equipment being able to implement such a processing function as a timing function at any place whenever necessary.

BEST MODE FOR CARRYING OUT THE INVENTION

First Embodiment

Figure 1:
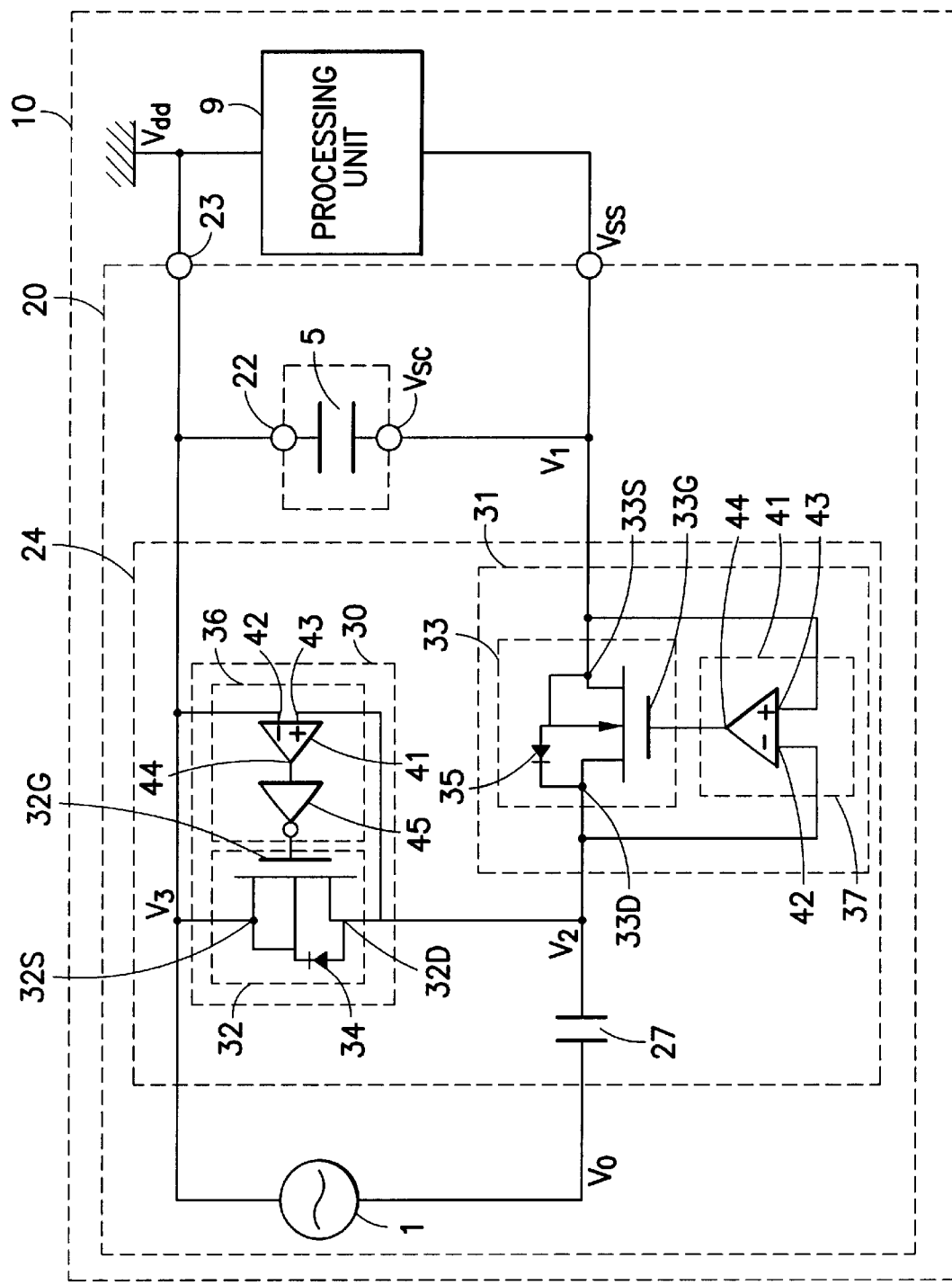
FIG. 1 is a block diagram showing the schematic configuration of a power supply apparatus and electronic equipment in accordance with the present invention, unidirectional units being adopted.
Figure 11:
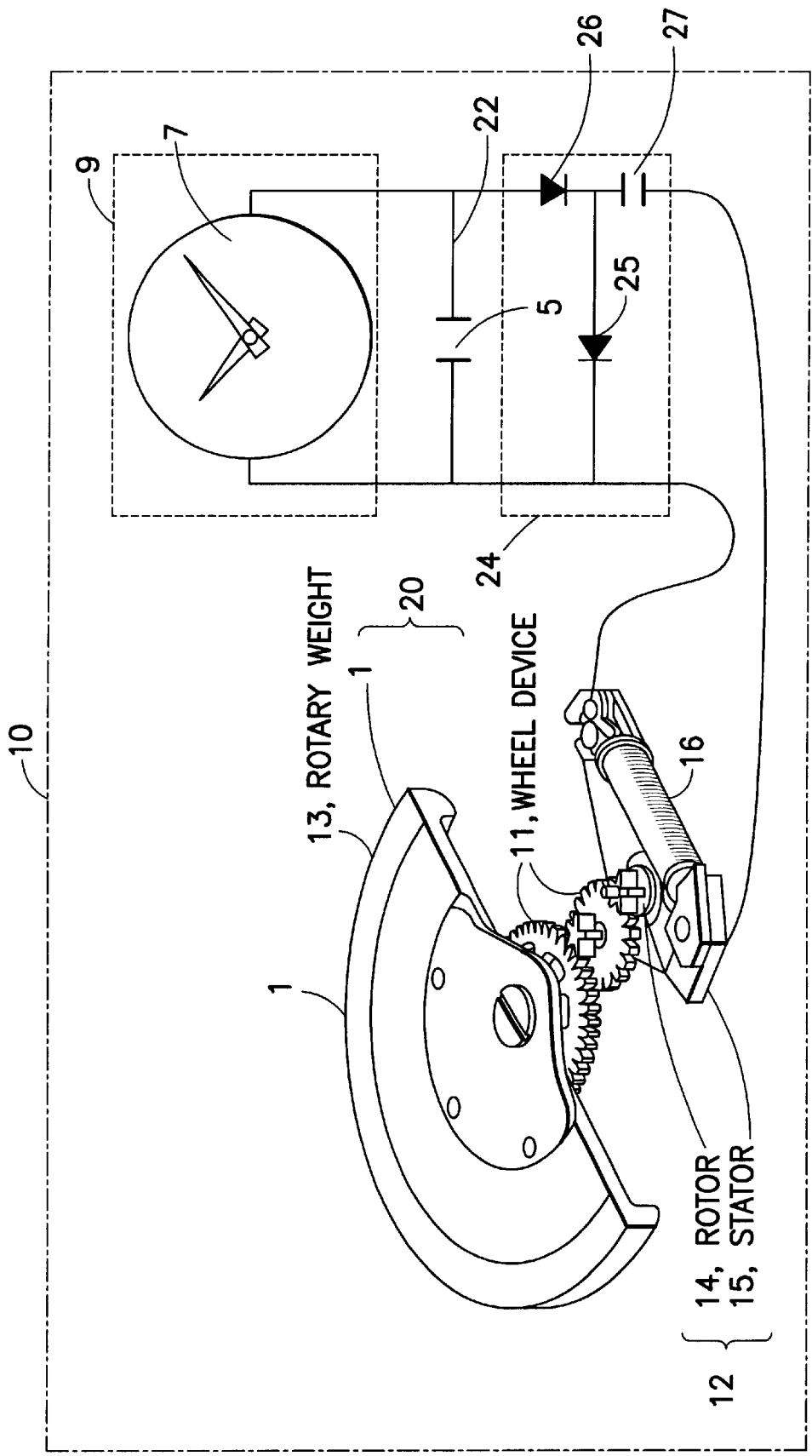
FIG. 11 is a block diagram showing an example of conventional electronic equipment.
Figure 12:
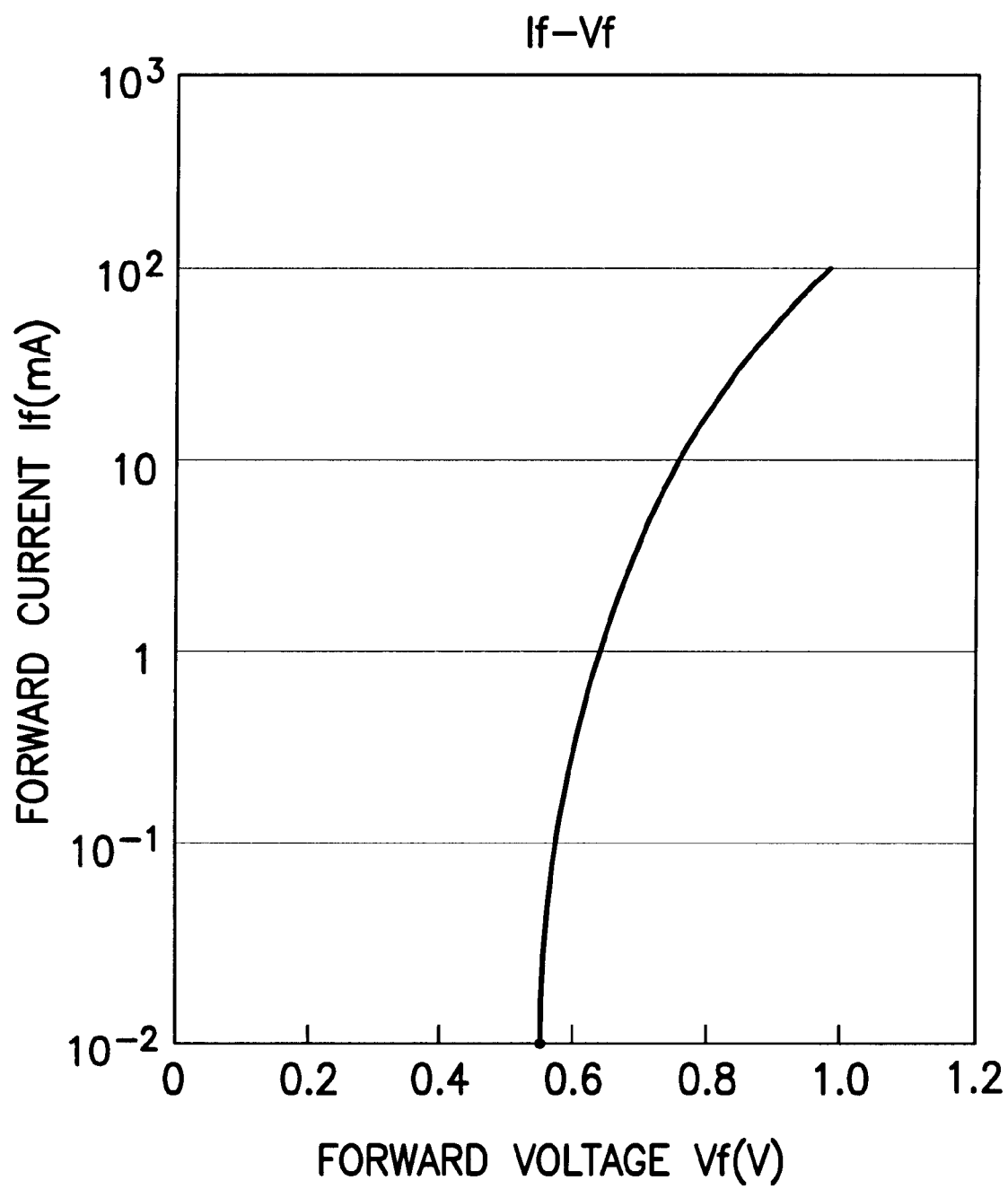
FIG. 12 is a graph showing the characteristics of the forward voltage of a diode.

With reference to the accompanying drawings, the present invention will be explained in more detail. FIG. 1 shows the outline of electronic equipment provided with a power generating unit in accordance with the present invention. A power supply apparatus 20 of electronic equipment 10 in this embodiment can be built in such a wristwatch device as the one explained in conjunction with FIG. 11; it is equipped with a power generating unit 1 capable of supplying AC power, and a rectifier circuit 24 which rectifies the power received from the power generating unit 1 and supplies it to a processing unit 9 such as a timing unit. Connected to a first output terminal 22 and a second output terminal 23 of the power supply apparatus 20 in this embodiment are a large-capacity capacitor 5 serving as a charging unit, and a processing unit 9, respectively; obviously, the processing unit 9 may be provided with a function such as a radio, pager, or personal computer in addition to the timing function mentioned above.

The rectifier circuit 24 of the power supply apparatus 20 in this embodiment is equipped with an auxiliary capacitor 27 and two unidirectional units 30 and 31 to be able to perform boosting and rectification. In the wristwatch device 10 in this embodiment, a high voltage side Vdd is grounded to provide reference voltage. For this reason, herein after, a low voltage side Vss will be referred to as the output voltage, and the voltage values will be all indicated in absolute values.

The unidirectional units 30 and 31 employed for the rectifier circuit 24 in the embodiment are respectively equipped with a p-channel MOSFET 32 and an n-channel MOSFET 33; parasitic diodes 34 and 35 of the MOSFETS 32 and 33, respectively, are employed as the diodes for flowing current in one direction. Both unidirectional units 30 and 31 are respectively equipped with control circuits 36 and 37 which detect the voltages at sources (S) and drains (D) of the MOSFETs 32 and 33 and supply control signals to gates (G).

First, the unidirectional unit 30 is designed so as to allow the auxiliary capacitor 27 to be connected in parallel to the power generating unit 1; it is used to carry out half-wave rectification on AC power through the diode 34 thereof and to supply it to the auxiliary capacitor 27. In the circuit in the embodiment, a source side 32S of the p-channel MOSFET 32 is connected to the grounded Vdd, while a drain side 32D is connected to the auxiliary capacitor 27. Hence, the parasitic diode 34, the forward direction of which is from the drain 32D to the source 32S, can be used for the half-wave rectification, and the auxiliary capacitor 27 can be charged when the generated voltage V0 on the Vss side of the power generating unit 1 becomes higher than the ground voltage Vdd (positive direction).

Referring now also to the timing chart shown in FIG. 2, the configurations and operations of the unidirectional units 30 and 31 in the rectifier circuit 24 in the embodiment will be explained. First, the control circuit 36 which controls the MOSFET 32 constituting the unidirectional unit 30 is equipped with a comparator 41 which compares a voltage V3 at the source side 32S with a voltage V2 at the drain side 32D, and an inverter 45 which reverses the output of the comparator 41 and applies it to a gate 32G of the MOSFET 32. The voltage V3 at the source side is applied to a reverse input 42 of the comparator 41, while the voltage V2 on the drain side is applied to a non-reverse input 43. When current flows from the drain side 32D to the source side 32S, which is the forward direction for the diode 32, a forward voltage Vf is generated in the diode 34. This causes the voltage V2 at the drain side to become higher than the voltage V3 at the source side, causing a high-level signal to be issued from the output 44 of the comparator 41. This high-level signal is reversed by the inverter 45 and applied as a signal of a low level or a negative potential to the gate electrode 32G. This turns ON the p-channel MOSFET 32, causing current to flow through a channel formed in the MOSFET 32, bypassing the parasitic diode 34. Hence, there will be no voltage drop caused by the forward voltage Vf of the diode 34, so that the voltage V3 at the source side rises to the vicinity of the voltage V2 at the drain side, making it possible to reduce the loss attributable to the forward voltage Vf. There is, however, a voltage drop due to the channel formed by the MOSFET 32; hence, the voltage V3 at the source side is maintained lower than the voltage V2 at the drainside. The comparator 41 of the embodiment has an accuracy which is sufficient for detecting such a level of potential difference, and a state wherein the MOSFET 32 is ON can be maintained while current is flowing to the MOSFET 32 from the drain 32D to the source 32S.

Alternatively, it is possible to configure the comparator 41 by providing the comparator 41 with a detection voltage hysteresis so that a high-level signal is issued through the output 44 of the comparator 41 when the forward current flows into the diode 34 to generate the forward voltage Vf, causing a potential difference of a predetermined level or higher to take place between the non-reverse input 43 and the reverse input 42, and that the output 44 of the comparator 41 switches to a low-level signal when a predetermined potential difference which is smaller than the predetermined level of potential difference or a negative potential difference is produced. Thus, providing the difference (hysteresis) in detection voltage for turning the MOSFET 32 ON/OFF makes it possible to constitute the MOSFET 32 by a switch having a smaller channel voltage drop, or further, by an ideal switch having no voltage drop, permitting further improved rectifying effect.

Figure 2:
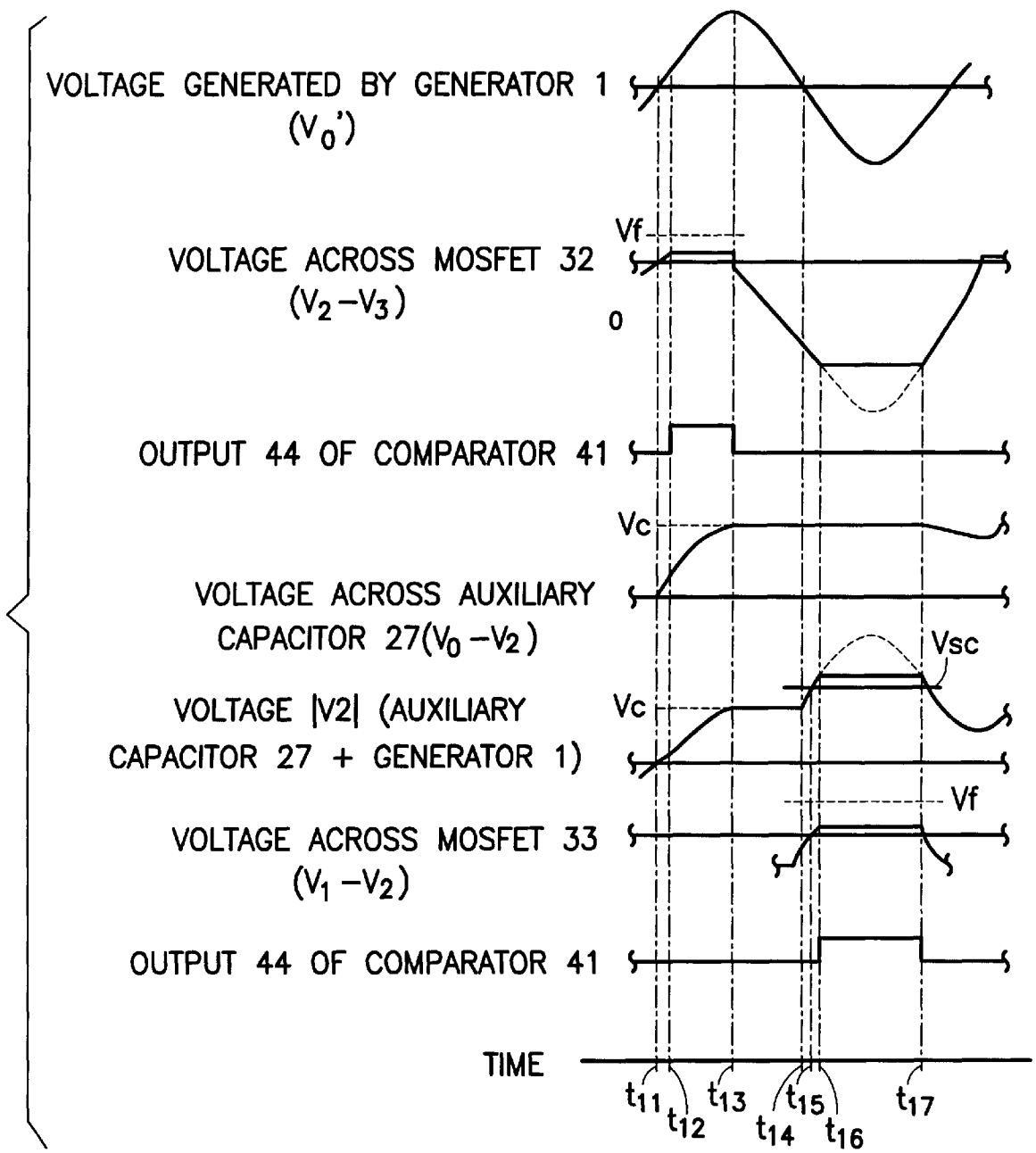
FIG. 2 shows a timing chart illustrative of the operation of a rectifier circuit shown in FIG. 1.

Referring to the timing chart of FIG. 2, if generated voltage V0', which is observed when the power generating unit 1 is under no load, switches to high level at time t11, i.e. if the Vss side becomes higher than the ground potential Vdd, then current flows into the diode 34, causing a voltage drop attributable to the forward voltage of the diode. This causes the voltage V2 at the drain side 32D of the voltages (V2–V3) across the MOSFET 32 to become higher, and upon the detection by the comparator 41 at time t12, the output 44 of the comparator 41 switches to the high level. Hence, the MOSFET 32 turns ON, and the voltages (V2–V3) across the unidirectional unit 30 does not reach the forward voltage Vf of the diode; as a result, only a very small voltage drop of about a few dozen mV occurs due to the channel of the MOSFET 32. Since current flows through the unidirectional unit 30, the auxiliary capacitor 27 is charged, and the voltages (V0–V2) at both ends thereof gradually rise.

When the AC power V0' of the power generating unit 1 starts to decrease at time t13, the electric charges are started to release from the auxiliary capacitor 27 which has been charged to a peak voltage Vc. The moment the discharge from the auxiliary capacitor 27 is begun, the voltage V2 at the drain side 32D becomes lower than the voltage V3 at the source side 32S, so that the output of the comparator 41 switches to the low level. This causes a high-level signal resulting from the inversion by the inverter 45 is supplied to the gate electrode 32G of the p-channel MOSFET, turning the p-channel MOSFET 32 OFF. When the voltage V3 at the source side becomes higher than the voltage V2 at the drain side, the voltage is reversed also in the diode 34. Hence, current does not flow through the diode 34. Thus, the unidirectional unit 30 turns OFF and the discharge from the auxiliary capacitor 27 is blocked; and at time t13 and after, a voltage of the sum of the generated voltage V0' of the power generating unit and the voltage Vc (or the difference therebetween if the polarity is reversed) appears as the voltage across the MOSFET 32.

When the phase of the AC power V0' changes at time t14 and the generated voltage V0 drops to a level lower than the ground voltage Vdd (down to a negative level), the auxiliary capacitor 27 is connected in series through the unidirectional unit 31. The other unidirectional unit 31 employed in the rectifier circuit 24 of the embodiment allows the auxiliary capacitor 27 to be connected in series to the power generating unit 1; it carries out half-wave rectification on the AC power through the diode 35 thereof, and supplies it together with the voltage charged in the auxiliary capacitor 27 to the output terminals 22 and 23. Thus, according to the power supply apparatus 20 of this embodiment, the AC power generated by the power generating unit 1 is supplied as DC power, which has been stepped up twofold, to the large-capacity capacitor 5 connected to the output terminal 22 and the processing circuit 9 connected to the output terminal 23.

In the rectifier circuit 24 of this embodiment, the second unidirectional unit 31 employs an n-channel MOSFET 33; the source side 33S of the MOSFET 33 is connected to the output terminals 22 and 23, and the drain side 33D is connected to the auxiliary capacitor 27. This makes it possible to use the parasitic diode 35, the forward direction of which is from the source 33S to the drain 33D, for the half-wave rectification, and the power generated by the power generating unit 1 to be supplied in addition to the power charged in the auxiliary capacitor 27 to the output terminals 22 and 23 when the generated voltage V0 drops to a level lower than the ground voltage Vdd.

The control circuit 37 for controlling the MOSFET 33 is equipped with the comparator 41 for comparing the voltage VI at the source side 33S with the voltage V2 at the drain side 33D; the output 44 of the comparator 41 is applied to the gate 33G of the MOSFET 33. The voltage V2 at the drain side is applied to the reverse input 42 of the comparator 41 and the voltage V1 at the source side is applied to the non-reverse input 43. When current flows from the source side 33S to the drain side 33D, which is the forward direction of the diode 35, the forward voltage Vf appears in the diode 35. This causes the voltage V1 at the source side to become higher than the voltage V2 at the drain side, and a high-level signal is issued through the output 44 of the comparator 41. The high-level signal is applied to the gate electrode 33G, so that the n-channel MOSFET 33 turns ON and current flows through the channel formed in the MOSFET 33, bypassing the parasitic diode 35. Hence, there is no voltage drop anymore because of the forward voltage Vf of the diode 35; therefore, the voltage V1 at the source side drops to a level near the voltage V2 at the drain side, thus permitting the loss caused by the forward voltage Vf to be reduced. In this unidirectional unit 31 also, there is a voltage drop due to the channel formed in the MOSFET 33; hence, the voltage V1 at the source side is maintained at a level higher than the voltage V2 at the drain side; the potential difference is detected by the comparator 41 in this embodiment, and the MOSFET 33 stays ON as long as current is flowing from the source 33S to the drain 33D.

In this unidirectional unit 31 also, it is possible to configure the comparator 41 by providing the comparator 41 with a detection voltage hysteresis so that a high-level signal is issued through the output 44 of the comparator 41 when the forward current flows into the diode 35 to generate the forward voltage Vf, causing a potential difference of a predetermined level or higher to take place between the non-reverse input 43 and the reverse input 42, so that the output 44 of the comparator 41 switches to a low-level signal when a predetermined potential difference which is smaller than the predetermined level of potential difference or a negative potential difference is produced. Thus, providing the difference (hysteresis) in detection voltage for turning the MOSFET 33 ON/OFF makes it possible to constitute the MOSFET 33 by a switch having a smaller channel voltage drop, or further, by an ideal switch having no voltage drop, permitting further improved rectifying effect.

Referring to the timing chart shown in FIG. 2, the operation of the unidirectional unit 33 will be summarized. At time t14, the phase of the generated voltage V0' of the power generating unit changes and the voltage drops to a level lower than the ground potential Vdd; at time t15 when the voltage (V1–V2) across the MOSFET 33 switches to a positive value, i.e. when the sum of the voltage Vc of the auxiliary capacitor 27 and the generated voltage V0' reaches the charging voltage Vsc or more of the large-capacity capacitor (in terms of an absolute value because the value is negative), current flows through the diode 35. The forward voltage appears across the MOSFET 33 and it is detected by the comparator 41 at time t16. As a result, the MOSFET 33 turns ON, and the voltage drop across the MOSFET 33 does not reach the forward voltage Vf and it stays at a level of about the voltage drop due to the channel. Thus, the large-capacity capacitor 5 is charged in a state where the voltage drop caused by the unidirectional unit 33 is extremely small.

When the generated voltage V0' exceeds the peak and the sum of the voltage V0' and the voltage Vc of the auxiliary capacitor 27 drops down to the charging voltage Vsc or less of the large-capacity capacitor 5 (although the value includes the voltage drop caused by the channel of the MOSFET 33) at time t17, the charging voltage Vsc of the large-capacity capacitor 5 becomes higher, so that the discharge from the large-capacity capacitor 5 begins. The moment the discharge from the large-capacity capacitor 5 begins, as mentioned above, the voltage V1 at the source side 33S becomes lower than the voltage V2 at the drain side 33D, so that the output 44 of the comparator 41 switches to the low level. Hence, the n-channel MOSFET 33 turns OFF and the reverse voltage appears in the diode 35, so that the discharge from the large-capacity capacitor 5 is blocked by the unidirectional unit 33.

When the phase of the AC power supplied from the power generating unit 1 changes and the generated voltage V0 becomes higher than the ground voltage Vdd, the auxiliary capacitor 27 is connected in parallel to the power generating unit 1 through the other unidirectional unit 30, thus charging the auxiliary capacitor 27. Meanwhile, in the unidirectional unit 31, no current flows when the voltage V2 at the drain side is lower than the voltage V1 at the source side (in terms of voltage, when V2 becomes higher than V1). Therefore, even if there is an input from the power generating unit 1, no current flows if the generated voltage V0 is lower than the charging voltage Vsc of the large-capacity capacitor 5, thus preventing the electric charges charged in the large-capacity capacitor 5 from being discharged. The MOSFETs 32 and 33 in this embodiment are of the enhancement type; when no voltage is applied to the gates 32G and 33G, the MOSFETs 32 and 33 are OFF, enabling the functions of the diodes 34 and 35 to be implemented. Even when the large-capacity capacitor 5 has no voltage and the control circuits 36 and 37 do not operate, the diodes 34 and 35 constitute the rectifier circuit 24, so that the power of the power generating unit 1 can be rectified and supplied to the large-capacity capacitor 5 and the processing unit 9.

Thus, the unidirectional units 30 and 31 of this embodiment are able to block reverse current and also to reduce the loss of the forward voltage with respect to forward current to approximately the level of the loss due to the ON resistance of the MOSFETs 32 and 33. Hence, the auxiliary capacitor 27 can be charged up to a level near the generated voltage V0 by the unidirectional unit 30, and also, a voltage which is approximately twice as large as the generated voltage V0 and which includes the voltage charged in the auxiliary capacitor 27 as the rectified voltage, can be supplied to the output terminals 22 and 23 by the unidirectional unit 31. Thus, the rectifying efficiency ηc shown by formula (2) can be markedly improved. When current flows in the reverse direction of the unidirectional units 30 and 31, the MOSFETs 32 and 33 turn OFF, so that backflow can be blocked by the diodes 34 and 35. Hence, leakage loss can be reduced. The leakage loss can be reduced approximately to a reverse leakage current of the MOSFETs, i.e. to 1 nA or less which is almost a negligible level, by using the unidirectional units; this is extremely effective particularly in a low-power system such as wristwatch with current consumption of hundreds of nanoamps. Thus, in the power supply apparatus 20 wherein the rectifier circuit 24 is constructed by the unidirectional units in accordance with the present invention, the generated power can be supplied to the output terminals 22 and 23 with very little loss. Therefore, a power supply apparatus having high power feeding efficiency with lower loss can be provided; electric energy obtained from the motion of a rotary weight can be efficiently supplied to the processing circuit 9 of a timing device, enabling the function thereof to be implemented. Moreover, the electric energy can be supplied to the large-capacity capacitor 5 connected to the output terminal 22 to charge the large-capacity capacitor 5, so that the processing unit 9 can be continuously operated on the power of the large-capacity capacitor 5 even if the power generating unit 1 can no longer generate power. Thus, according to the present invention, small electronic equipment suited for carrying can be provided.

Second Embodiment

Figure 3:
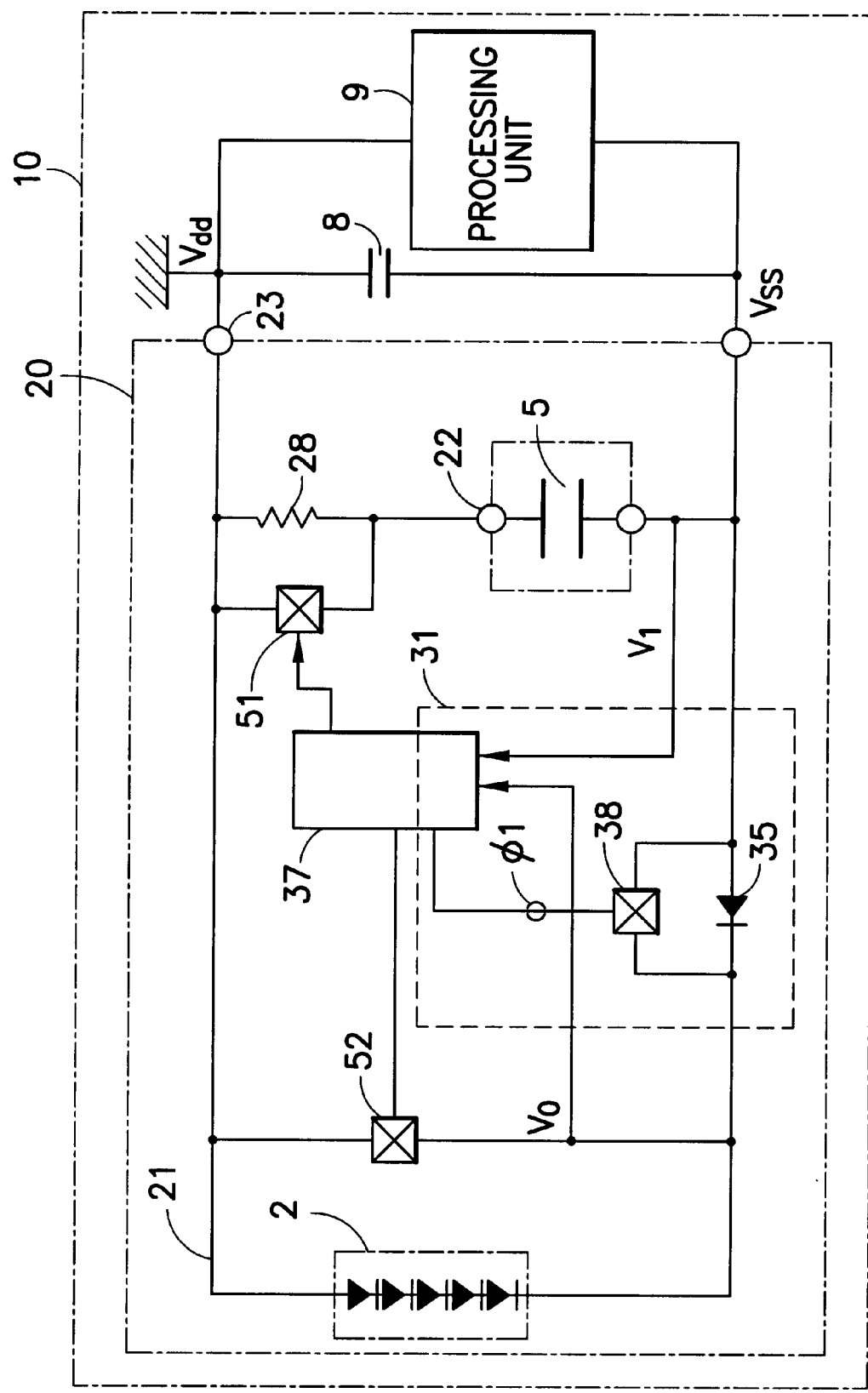
FIG. 3 is a block diagram showing the outline of a power supply apparatus and electronic equipment in accordance with the present invention which are equipped with unidirectional units in accordance with a second embodiment of the invention.

FIG. 3 shows another embodiment of the present invention; it gives an outline of electronic equipment 10 wherein a processing unit 9 such as a timing device can be operated by a solar battery 2, which is a DC power supply. The electronic equipment 10 is provided with a power supply apparatus 20 which supplies the DC power from the solar battery 2 to a large-capacity capacitor 5 serving as a charging device, and a processing unit 9. The power supply apparatus 20 is equipped with a first output terminal 22 connected to the large-capacity capacitor 5 and a second output terminal 23 connected to the processing unit 9. A resistor 28 for startup is connected in series to the second output terminal 23 with respect to the first output terminal 22, i.e. the large-capacity capacitor 5, a bypass switch 51 being connected in parallel to the resistor 28. Hence, when the charging level of the large-capacity capacitor 5 is low, sufficient voltage is generated at the output terminal 23 connected to the processing unit 9 by the resistor 28 for startup in order to prevent power from being consumed mainly at the large-capacity capacitor 5. When a certain level of voltage is generated at the large-capacity capacitor 5, the startup resistor 28 is bypassed by the bypass switching 51 so that the large-capacity capacitor 5 can be charged efficiently.

Mainly for stabilizing the operating voltage, an auxiliary capacitor 8 is connected in parallel to the processing unit 9 in this embodiment. Further, the power supply apparatus 20 has a switch 52 for short-circuiting connected in parallel to the solar battery 2; if a generated voltage V0 of the solar battery 2 becomes too high and reaches a level adversely affecting the processing unit 9 or the large-capacity capacitor 5, then the input from the solar battery 2 is short-circuited to prevent an output voltage V1 from becoming too high. To conduct such control, the power supply apparatus 20 is equipped with a control circuit 37; the control circuit 37 monitors the generated voltage V0 and the output voltage V1 at the output terminal 23 of the large-capacity capacitor 5 so that the short-circuit switch 52 and the bypass switch 51 can be operated.

In this power supply apparatus 20, if the output of the solar battery 2 which converts discontinuous optical energy into power drops, then the power discharged from the large-capacity capacitor 5 is supplied from the output terminal 22 to the output terminal 23 to drive the processing unit 9.

At this time, if the current flows from the large-capacity capacitor 5 to the solar battery 2, the power may be consumed or may damage the solar battery 2. For this reason, the power supply apparatus 20 is provided with a unidirectional unit 31 for preventing the backflow from the large-capacity capacitor 5 to the solar battery 2.

Figure 4:
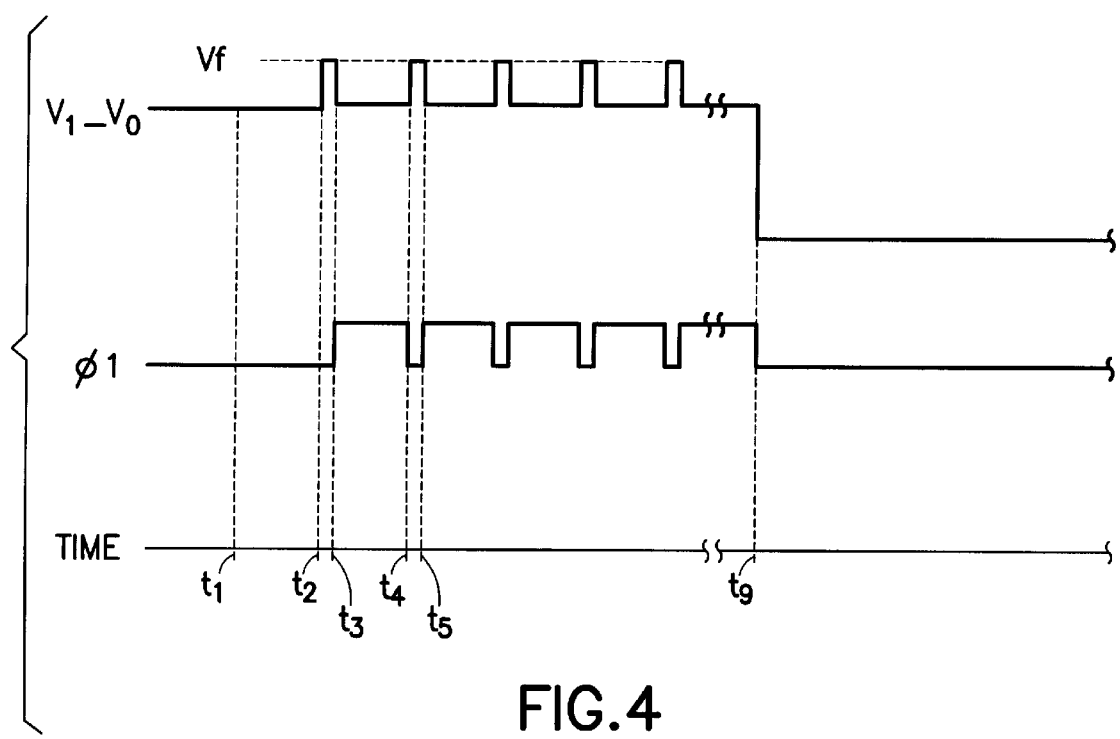
FIG. 4 is a timing chart illustrative of the control signals for operating the switches of the unidirectional units shown in FIG. 3.

The unidirectional unit 31 is equipped with: a diode 35 which is connected so that current flows when the electromotive force V0 of the solar battery 2 is larger, in terms of absolute value, than the voltage V1 at the output terminal 22 connected to the large-capacity capacitor 5; and a switch 38 connected in parallel to the diode 35, the switch 38 being operated by a control signal Φ1 from the control circuit 37. FIG. 4 shows an example of the control signal Φ1. Introduced in the control circuit 37 are the generated voltage V0 and the output voltage V1 of the output terminal 22; these voltages V0 and V1 correspond to the voltages at both ends of the diode 35. First, if the solar battery 2 is not generating power and no charge has been accumulated in the large-capacity capacitor 5 at time t1, then the generated voltage V0 and the output voltage V1 are 0, and the difference therebetween is accordingly 0. Hence, the control signal Φ1 is held at a low level, and the switch 38 is OFF. To turn the switch OFF while the power supply for control cannot be secured, a field-effect transistor switch of, for example, an enhancement type MOSFET may be used.

Next, when the solar battery 2 starts power generation at time t2, the generated voltage V0 increases (to the negative side). Hence, current flows into the diode 35 and the forward voltage Vf is generated. This causes the voltage V1 at the other end of the diode 35 to decrease to the positive side from the generated voltage V0. The control circuit 37 detects the potential difference and shifts the control signal Φ1 to the high level at time t3 to turn the switch 38 ON. As a result, the power from the solar battery 2 flows, bypassing the diode 35, and it is supplied to the large-capacity capacitor 5 and the processing circuit 9 without the loss attributable to the forward voltage Vf.

The moment the bypass switch 38 is turned ON, the influences of the forward voltage Vf are eliminated by the diode 35, so that very little difference is present between the voltages V1 and V0. There is, of course, a voltage drop caused by the switch 38; therefore, this voltage drop may be detected to control the bypass switch 38 as in the embodiment described above. In this embodiment, at time t4 when a predetermined time has passed since the bypass switch 38 was turned ON, the bypass switch 38 is turned OFF once. If the forward voltage Vf attributable to the diode 35 is detected when the bypass switch 38 is turned OFF, the bypass switch 38 is turned back ON again at time t5. Thus, in the unidirectional unit 31 of this embodiment, the bypass switch 38 is turned OFF at regular intervals to sample the forward voltage Vf so as to detect the direction of the current flowing through the diode 35. The charging efficiency, therefore, is sacrificed since the forward voltage Vf of the diode 35 appears at regular intervals between the solar battery 2 and the large-capacity capacitor 5. However, the influences of the forward voltage Vf can be removed while the switch 38 is ON. Therefore, the power supplying efficiency of the voltage supply apparatus 20 can be markedly improved as compared with a conventional voltage supply apparatus wherein the loss due to the forward voltage Vf is produced at all times.

When the solar battery 2 stops power generation at time t9, the difference between the voltages V1 and V0 is reversed and the absolute value of the voltage V0 becomes smaller. This causes the control signal Φ1 to be switched to the low level, turning the switch 38 OFF. If the value obtained by subtracting the voltage V0 from the voltage V1 becomes negative, then it means the reverse direction also for the diode 35, so that no current flows. Hence, no current flows through the unidirectional unit 31 in this embodiment, and the power does not flow back from the large-capacity capacitor 5 to the solar battery 2, the power of the large-capacity capacitor 5 is supplied to the processing unit 9 via the output terminal 23, and the processing unit 9 continues to work.

Thus, the power supply apparatus 20 in this embodiment also employs the unidirectional unit 31 in accordance with the present invention to prevent backflow so as to prevent the loss caused by the forward voltage Vf of the diode, thereby permitting efficient transfer of power. Moreover, the loss caused by the forward voltage Vf can be removed when the power of the large-capacity capacitor 5 is supplied to the processing unit 9; therefore, it is possible to adopt an element having a high forward voltage Vf and to adopt a silicon diode, which has small reverse leakage current and which is capable of reducing leakage loss, as the backflow preventing element 35.

In this embodiment, an emphasis has been placed on the description of the operations and advantages of the resistor 28, the switch 51, the capacitor 8, and the switch 52; however, it is obvious that the similar operations and advantages can be obtained by applying the constituents to the first embodiment described above. Furthermore, in this embodiment, the bypass switch 38 of the unidirectional unit 31 is turned OFF periodically to detect the direction of the current flowing through the diode; the similar operation is possible also with the MOSFETs 32 and 33 in the first embodiment. By detecting the direction of the current flowing through the diodes 34 and 35 in a sampling mode according to the foregoing method, the rectifier circuit can be configured by employing an ideal MOSFET with no voltage drop due to a channel, permitting further more a efficient supply of power. The detection of the direction of current or the direction of voltage in the sampling mode allows the comparator 41 to also work in the sampling mode (here and there), so that the power consumption of the control circuit can be reduced, permitting yet improved power supply efficiency accordingly.

Thus, the power supply apparatus in accordance with the present invention detects the forward voltage attributable to the diode and turns ON the switch for bypassing the diode so as to make it possible to prevent the loss caused by the forward voltage. This means that the loss in the rectifier circuit for rectifying AC power and the loss in the backflow preventing element can be considerably reduced, and power can be transferred from the input terminal to the output terminal without the loss caused by the forward voltage. Further, in the unidirectional unit in accordance with the present invention, the switch is turned OFF when voltage is applied in the reverse direction so as to prevent backflow by the diode; hence, the backflow from the output terminal to the input terminal can be also prevented as in the conventional one, thus making it possible to prevent wasting the power which has been accumulated in the large-capacity capacitor or the auxiliary capacitor of the processing unit.

Thus, by connecting a power generating unit such as a solar battery or a thermoelectric device which outputs direct current or a power generating unit such as an electromagnetic generator or the one employing a vibration-type thermoelectric device which outputs alternating current to the input terminal of the power supply apparatus in accordance with the present invention, it is possible to provide a power generating unit with high power feed efficiency which is free of the loss caused by the forward voltage of the diode and which has less leakage loss. Accordingly, the power generating unit in accordance with the present invention makes it possible to provide a power generating unit which is suited for carrying and which enables power to be supplied efficiently from a solar battery or a thermoelectric device of a low energy density or from a power generator, which employs a rotary weight for catching the movement of a user thereof to generate power, to a processing unit or a charging unit. Furthermore, the unidirectional unit in accordance with the present invention is composed of a combination of a diode and a switch or of a field-effect transistor such as a MOSFET and a parasitic diode thereof; this extremely simple structure makes it possible to reduce the size of the unit and makes the unit ideally used for a portable power generating unit. Portable, self-power-generating electronic equipment can be provided by incorporating the power supply apparatus or power generating unit in accordance with the present invention together with a processing unit equipped with a timing function; it is also possible to provide electronic equipment capable of continuously operating a processing unit for a long time under various environments by using it in combination with a charging device such as a large-capacity capacitor. The electronic equipment in accordance with the present invention can be implemented as a wristwatch or other portable or vehicle-mounted type; it is not limited to the electronic equipment provided with the timing function described in the above embodiments, and it is evidently possible to incorporate a variety of processing units which operate by consuming the power of IC cards, radio receivers, or information terminals such as pagers, telephones, radios, hearing aids, pedometers, electronic calculators, or electronic pocketbooks.

It is also obvious that the present invention is not limited to the circuit examples of the foregoing electronic apparatuses 10 described above. For example, as the unidirectional units of the rectifier circuit of the AC power supply shown in FIG. 1, the unidirectional units for blocking back flow shown in FIG. 3 may alternatively be used, or the vice versa may of course acceptable. Further, it is obvious that the rectifier circuit may be a circuit for performing full-wave rectification by combining a bridge type with the unidirectional units or a circuit for performing half-wave rectification by using the unidirectional units, or the like in place of the boosting and rectifier circuit mentioned above. Likewise, the boosting and rectification is not limited to the foregoing twofold boosting; it is obvious that a booster circuit of threefold or more may be employed. Furthermore, as the switch for bypassing the diode, a bipolar transistor switch may be used in place of the unipolar transistor such as the field-effect transistor; the power supply apparatus may be provided in the form of an IC or it may be mounted together with a processing unit on the same semiconductor substrate, and other variations are possible.

Third Embodiment

Figure 5:
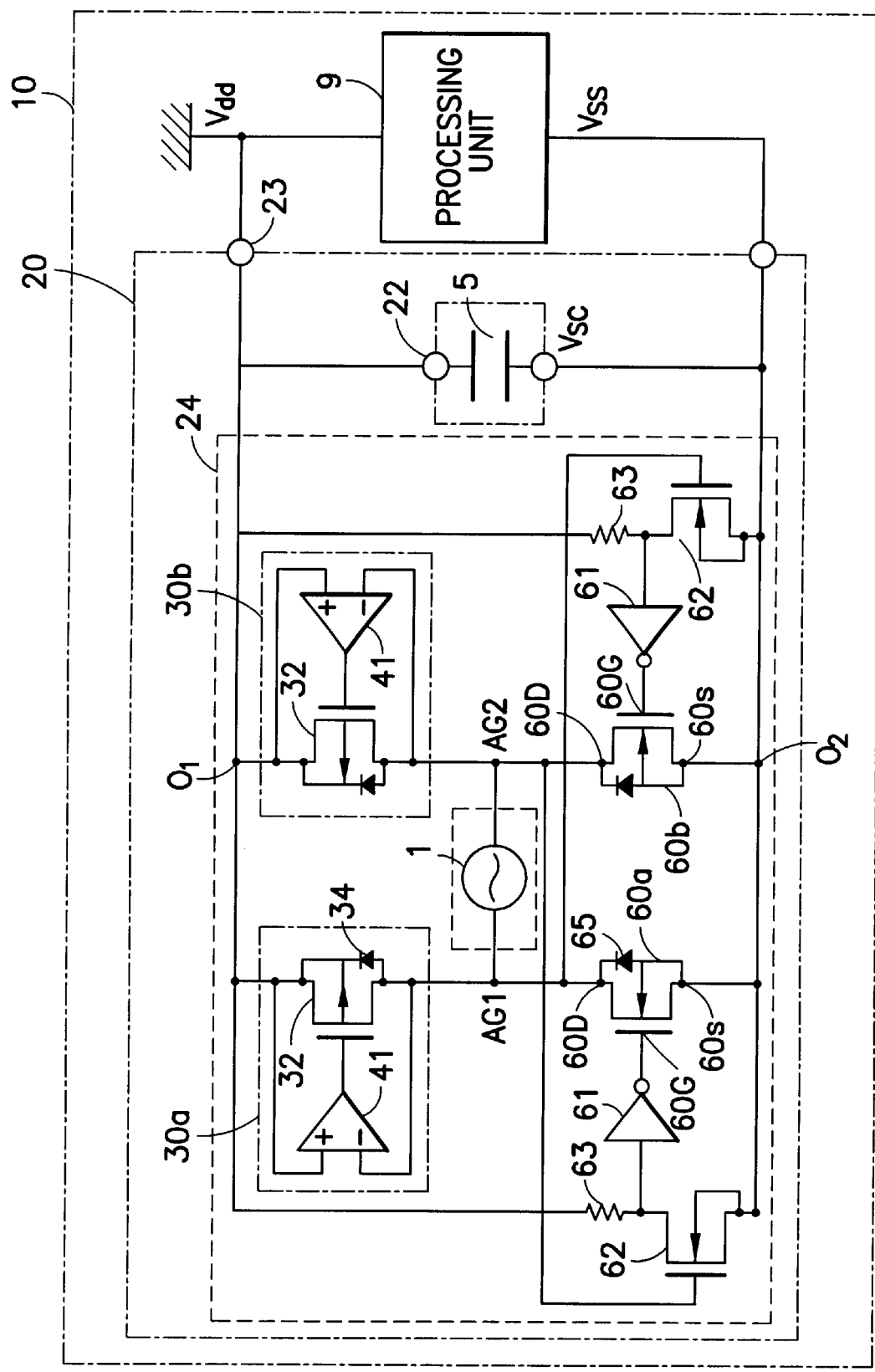
FIG. 5 is a block diagram showing the outline of a power supply apparatus and electronic equipment which perform full-wave rectification by employing unidirectional units.

FIG. 5 shows an example of a power supply apparatus 20 which is able to carry out full-wave rectification on the AC power from a power generating unit 1 by employing a unidirectional unit 30 and supply it to a processing unit 9 and a charging unit 5. As previously mentioned, it is possible to assemble four unidirectional units into a bridge to carry out the full-wave rectification; however, in the power supply apparatus 20, the full-wave rectification is performed by constituting the bridge by unidirectional units 30a and 30b equipped with comparators 41 and MOSFETs 60a and 60b. Hence, a rectifier circuit 24 in this embodiment requires only two unidirectional units 30 and only two comparators 41 accordingly; therefore, the circuit is simplified, and the semiconductor device (ASIC) on which the rectifier circuit 24 is mounted can be made smaller, making it possible to realize the power supply apparatus 20 which is further inexpensive and which can be easily mounted on portable electronic equipment.

In the rectifier circuit 24 of this embodiment, in order to form the bridge, the two unidirectional units 30a and 30b are connected in parallel between input terminals AG1 and AG2 connected to the power generating unit 1 and one output terminal 01 connected to the charging unit 5 and the processing unit 9, and the MOSFETS 60a and 60b for rectification are connected in parallel between the input terminals AG1 and AG2 and the other output terminal 02. The unidirectional units 30a and 30b are respectively equipped with p-channel MOSFETs 32 and comparators 41 for control; the detailed configurations of these components are the same as those of the unidirectional units described above, so that the explanation thereof will be omitted. The MOSFETs 60a and 60b connected in parallel between the input terminals and the output terminal 02 are n-channel type; drain sides 60D are connected to the input terminals AG1 and AG2, respectively, of the power generating unit, and source sides 60S are connected to the output terminal 02. A gate terminal 60G of the MOSFET 60a is connected to the input terminal AG2, while the gate terminal 60G of the MOSFET 60b is connected to the input terminal AG1. The gate sides 60G of the MOSFETs 60a and 60b are connected to the input terminals AG2 and AG1 via inverters 61 and driving elements for driving the inverters, which driving elements are constructed by MOSFETs 62 and pull-up resistors 63. These driving elements can be driven by the voltages at AG1 and AG2 at the side of the power generating unit, and further, the MOSFETs 60a and 60b for rectification can be controlled, so that ON/OFF timing can be adjusted without influencing the MOSFETs 60a and 60b. In other words, any timing at which the rectifying MOSFETs 60a and 60b are actuated can be selected by changing the threshold values of the MOSFETs 62, which are the driving elements, as desired. The voltage at the side of the power generating unit may be directly supplied to the gate sides 60G of the rectifying MOSFETs 60a and 60b; however, if the threshold values are changed to adjust the timings, then the drive ability is deteriorated or leakage current increases, leading to deteriorated performance. In contrast thereto, providing the driving elements enables the timings to be adjusted without adversely affecting the performances of the MOSFETs 60a and 60b.

Figure 6:
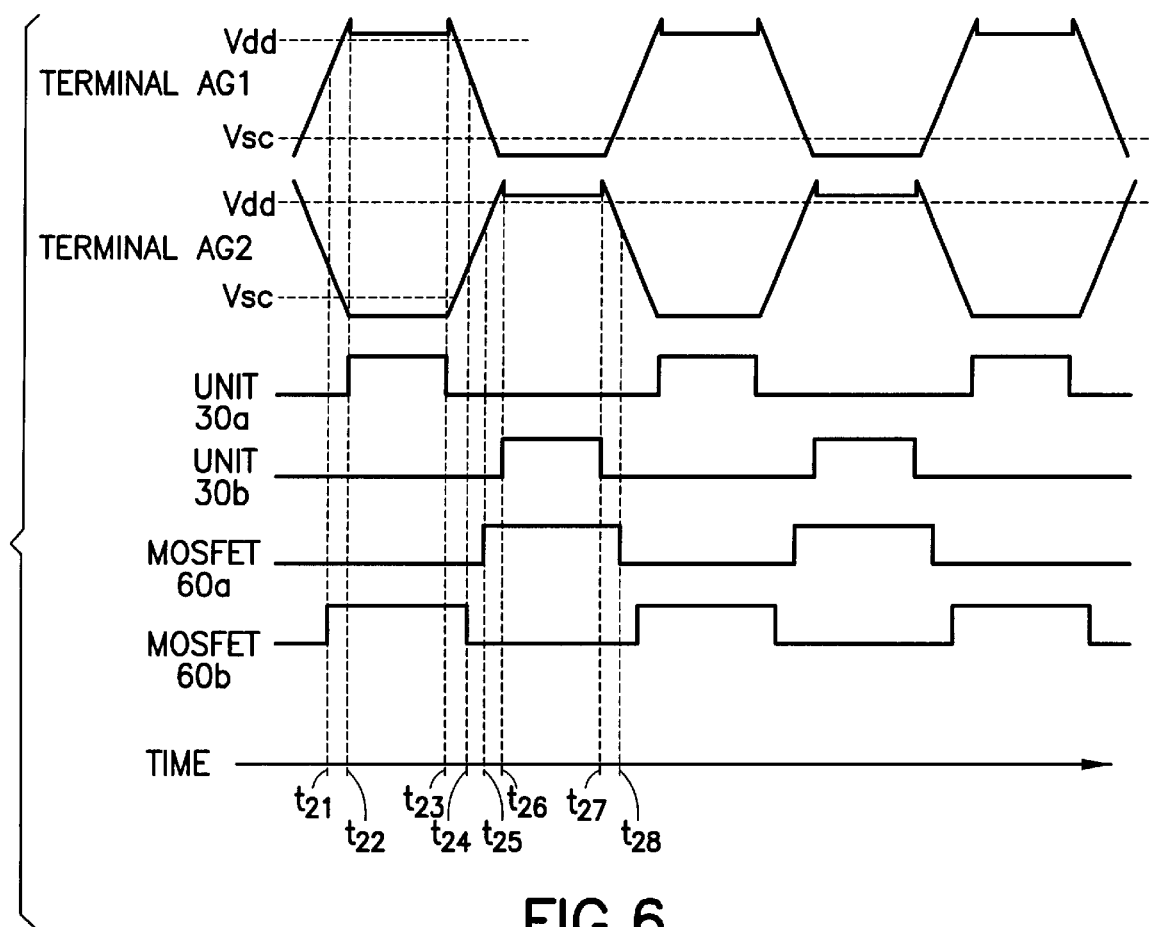
FIG. 6 is a timing chart illustrative of the operation of the power supply apparatus shown in FIG. 5.

Based on the timing chart shown in FIG. 6, the operation of the rectifier circuit 24 of the power supply apparatus 20 of this embodiment will be explained. In the power generating unit 1, when the power generating is begun, and the potential at the input terminal AG1 rises from a low potential Vsc to a high potential Vdd and reaches the threshold values of the MOSFETs 62, which are the driving elements, at time t21, the MOSFETs 62 turn ON. This causes the outputs of the inverters 61 to switch from the low potential to the high potential, turning the rectifying MOSFET 60b ON. Further, when the voltage at the input terminal AG1 rises and exceeds the charging voltage Vdd of the charging unit 5, forward voltage appears at the unidirectional unit 30a. Thus, when the voltages at both ends of the MOSFET 32 of the unidirectional unit 30a reach predetermined values at time t22, the outputs of the comparators 41 switch to the low potential and the MOSFETs 32 turn ON, allowing the unidirectional unit 30a to conduct without the loss caused by the forward voltage. Thus, the power from the power generating unit 1 is supplied to the charging unit 5 or the processing unit 9. The moment the electromotive force in the power generating unit 1 begins to reverse, the voltages at both ends of the MOSFET 32 of the unidirectional unit 30a drop at time t23, and the outputs of the comparators 41 switch to high level and the MOSFET 32 turns OFF. When the voltage at the input terminal AG1 further drops, the voltages lower to the threshold values or lower of the MOSFETs 62, which are the driving elements, and the rectifying MOSFET 60b also turns OFF at time t24. Hence, the current in the opposite direction no longer flows because of a parasitic diode 34 of the unidirectional unit 30a and a parasitic diode 65 of the MOSFET 60b.

The same is true when the electromotive force of the power generating unit 1 is reversed; the voltage at the input terminal AG2 rises and the rectifying MOSFET 60a turns ON at time t25, and the unidirectional unit 30b conducts at time t26 without the loss attributable to the forward voltage. Thus, the power is supplied from the power generating unit 1 to the charging unit 5 and the processing unit 9 with high efficiency. On the other hand, the voltage at the input terminal AG2 drops and the unidirectional unit 30b turns OFF at time t27, and the rectifying MOSFET 60a turns OFF at time t28. Thus, the current in the opposite direction no longer flows into the unidirectional unit 30b and the MOSFET 60a. The full-wave rectification is performed in this way; the loss caused by the forward voltage of the diodes when the unidirectional units 30a and 30b and further the MOSFETs 60a and 60b conduct can be prevented also when performing the full-wave rectification by employing the bridge of this embodiment. The electromotive force of the power generating unit 1 which can be built in portable electronic equipment is in a range from the forward voltage or less of a silicon diode to about a few times thereof; therefore, it is possible to provide a power supply apparatus implementing extremely high rectifying efficiency and high power feeding efficiency by eliminating the loss attributable to the forward voltage of the silicon diode as in the foregoing embodiments.

Instead of the pull-up resistor 63, an appropriate constant-current generating circuit may be connected between the high voltage side Vdd and the drain side of the n-channel MOSFET 62. The n-channel MOSFET 62 is OFF when no power is being generated in a steady state, so that no current flows via the resistor 63 and the MOSFET 62. This is true also when the constant-current source circuit is employed. Further, instead of the driving element composed of the n-channel MOSFET 62 and the pull-up resistor 63, a CMOS inverter circuit composed of an n-channel MOSFET and a p-channel MOSFET may be used. In this case also, the MOSFETs are OFF in a stable state and when no power is being generated, so that no current flows. It is further possible to insert pull-down resistors between the input terminal AG1 and a line voltage Vsc, and the input terminal AG2 and the line voltage Vsc to stabilize the potentials at the input terminals AG1 and AG2 in the steady state when no power is being generated.

Figure 7:
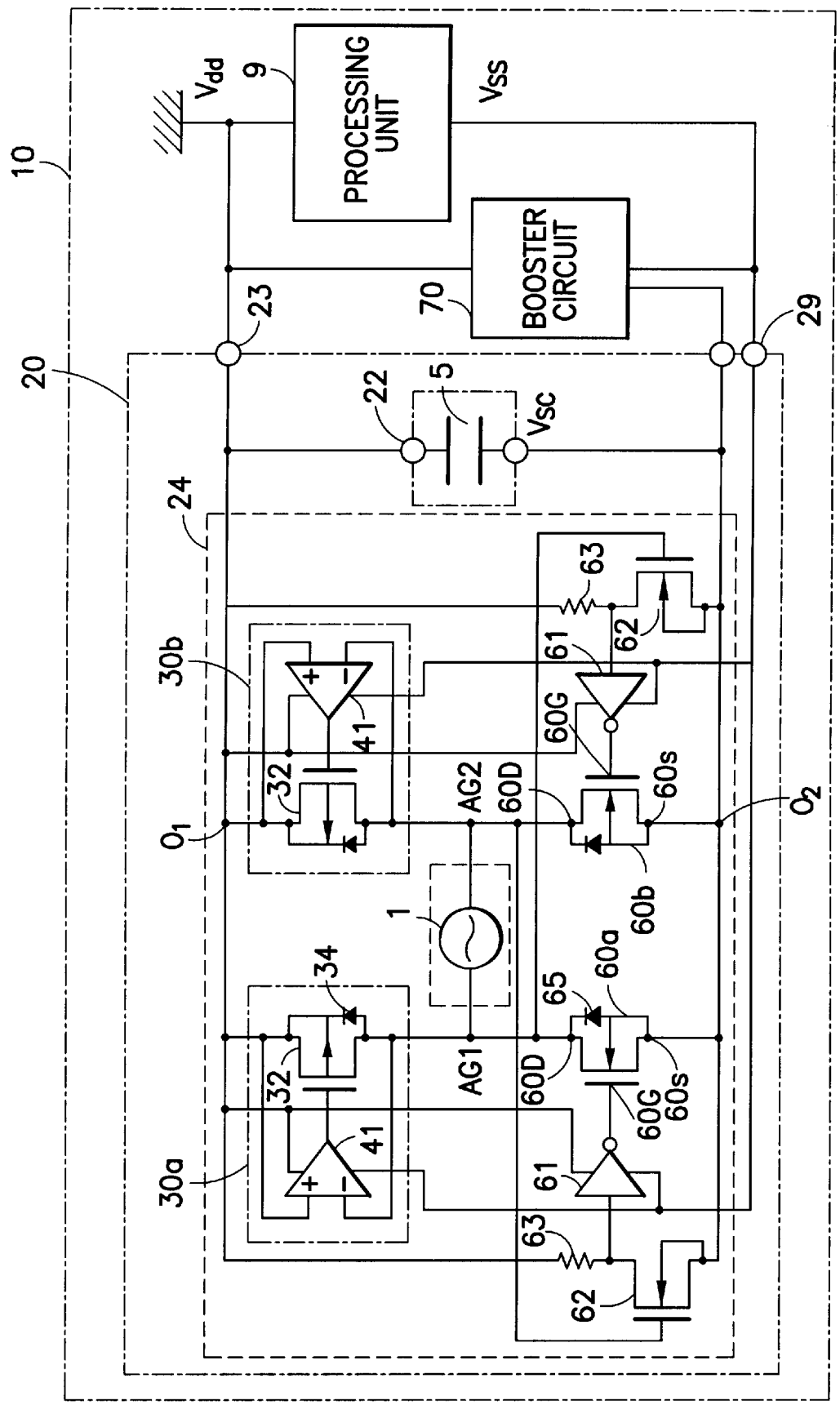
FIG. 7 is a block diagram showing a another embodiment the power supply apparatus and electronic equipment which perform full-wave rectification by employing unidirectional units.

FIG. 7 shows yet another example of the power supply apparatus 20 equipped with the rectifying circuit 24 which performs full-wave rectification by employing the unidirectional units 30a and 30b and the rectifying MOSFETs 60a and 60b. A wristwatch device 10 of this example is provided with a booster circuit 70 which boosts the Vsc discharged from a capacitor 5 to use it as a line voltage Vss to operate the processing unit 9. Such a booster circuit 70 can be implemented by employing a circuit or the like capable of boosting of two, three, or more steps by switching among a plurality of capacitors. of course, the booster circuit 70 is also able to supply the voltage Vsc of the capacitor 5 as the line voltage Vss without boosting it.

The power supply apparatus 20 of the example is further equipped with a power terminal 29 for receiving the line voltage Vss which has been rendered boostable by the booster circuit 70; the line voltage Vss is used as the operating power supply for the control circuit for the unidirectional units 30a and 30b and the rectifying MOSFETs 60a and 60b, i.e. for the comparators 41 and the inverters 61. Hence, even when the capacitor (large-capacity capacitor) 5 is being charged or even if the capacitor 5 is discharging and the voltage Vsc is dropping, the line voltage Vss which is obtained by boosting the voltage Vsc by several times enables the control of the unidirectional units 30a and 30b and the rectifying MOSFETs 60a and 60b. Hence, even during the early stage of charging or the end stage of discharging when the voltage Vsc of the capacitor 5 is low, a sufficiently high voltage for driving the MOSFETs constituting the switches can be secured, thus permitting quick, reliable switching operations with resultant efficient rectification. This leads to lower rectification loss in the early state of charging or the end stage of discharging. For example, when the voltage Vsc is small, approximately −0.5 V, with respect to the high potential Vdd, the line voltage Vss of, for example, about −1.5 V which is obtained by threefold boosting can be secured, making it possible to drive the p-channel MOSFET 32 of the unidirectional unit 30a by the line voltage Vss. The driving capability of the p-channel MOSFET increases by the square of the gate voltage thereof, so that about ninefold driving capability can be displayed by conducting control by using the boosted power, enabling efficient rectification.

Figure 8:
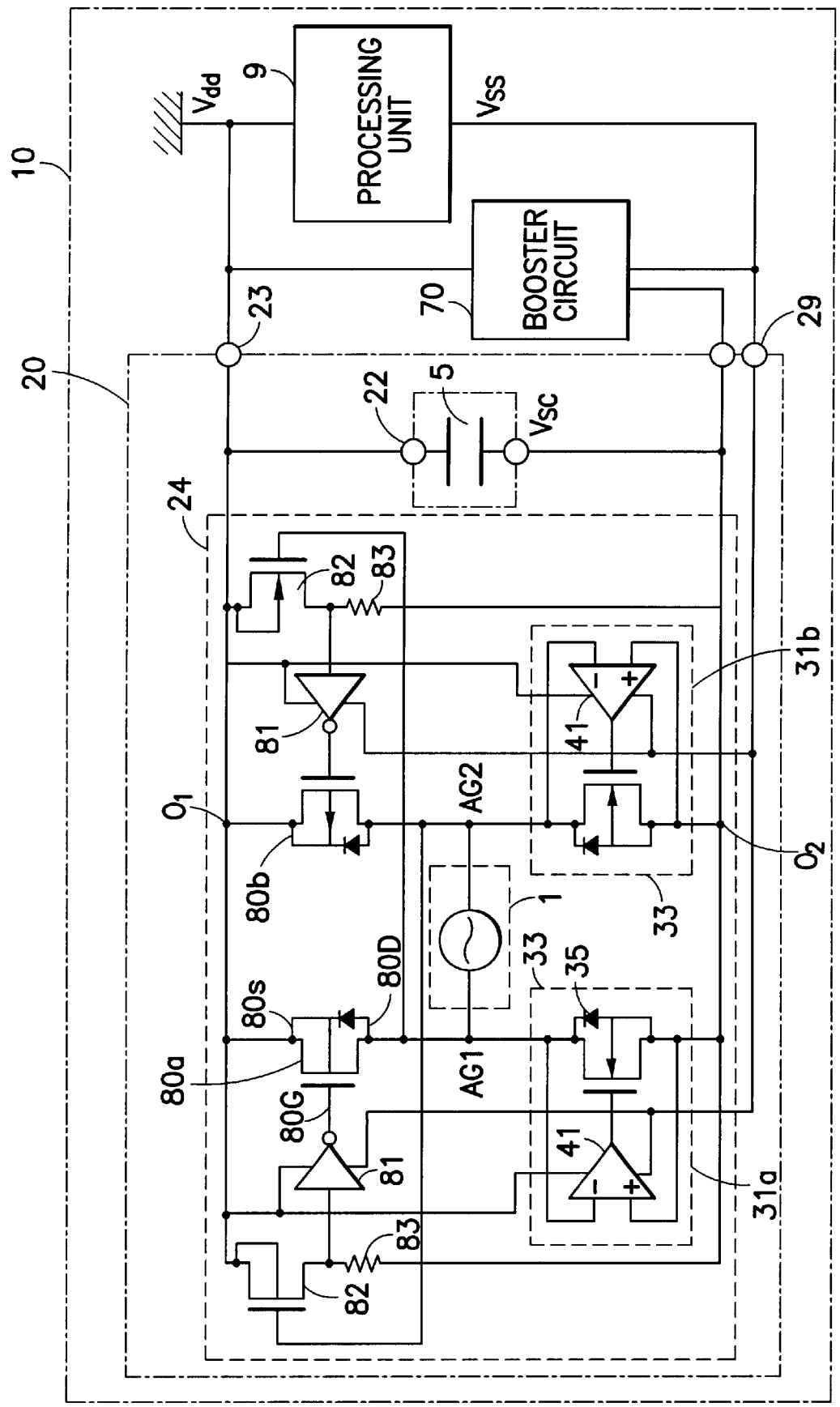
FIG. 8 is a block diagram showing another embodiment of the power supply apparatus and electronic equipment which perform full-wave rectification by employing unidirectional units.

FIG. 8 shows an example of still another power supply apparatus 20. In the power supply apparatus 20 of this example, unidirectional units 31*a* and 31*b* employing n-channel MOSFETs 33 are connected to the low potential side (the Vsc side) of the rectifier circuit 24 which performs full-wave rectification, while p-channel MOSFETs 80*a* and 80*b* are connected as the rectifying MOSFETs to the high potential side (the Vdd side). A gate terminal BOG of the MOSFET 80*a* is operated on the voltage at the input terminal AG2, while the gate terminal of the MOSFET 80*b* is operated on the voltage at the input terminal AG1 on the opposite side. The gate sides 80G of the MOSFETs 80*a* and 80*b* are provided with inverters 81 and driving elements composed of MOSFETs 82 for driving the inverters, and pull-down resistors 83. Further, a terminal 29 for receiving the line voltage Vss is provided so that the unidirectional units 31*a* and 31*b* and the rectifying MOSFETs 80*a* and 80*b* can be controlled by the line voltage Vss. The operations of these driving elements are the same as the circuits described in conjunction with FIG. 7, considering the difference in polarity; hence, detailed explanation will be omitted.

Thus, it is also possible to configure the power supply circuit 20 by reversing the polarity of the MOSFETs constructing the unidirectional units and the switches. Moreover, this example uses the unidirectional units 31*a* and 31*b* employing the n-channel MOSFETs having higher driving capability than the p-channel MOSFETs, so that the outputs of the comparators 41 controlling the unidirectional units can be made smaller according to the n-channel MOSFETs. Thus, the area required on a chip for implementing the unidirectional units for achieving the same driving capability can be reduced, and the power consumption can also be reduced as compared with the foregoing examples.

Fourth Embodiment

Figure 9:
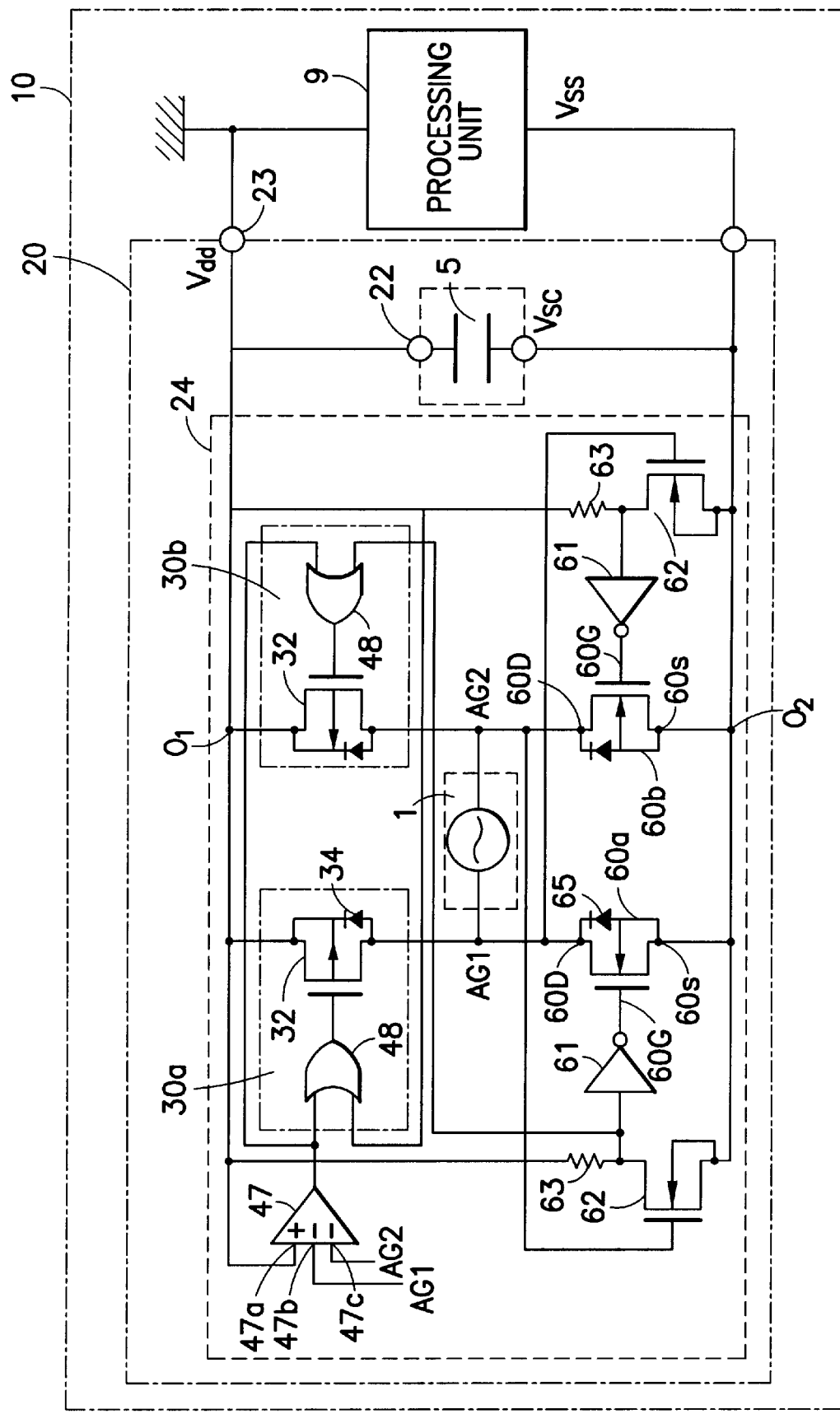
FIG. 9 is a block diagram showing still another embodiment of the power supply apparatus and electronic equipment which perform full-wave rectification by employing unidirectional units.

FIG. 9 shows another embodiment of a power supply apparatus 20 equipped with a rectifier circuit 24 which carries out full-wave rectification by employing unidirectional units 30*a* and 30*b* and rectifying MOSFETs 60*a* and 60*b*. In this embodiment, the unidirectional units 30*a* and 30*b* are respectively equipped with OR circuits 48 as the controllers of MOSFETs 32, and further equipped with a 3-input comparator 47 as the controller common to the unidirectional units 30*a* and 30*b*.

A non-reverse input 47*a* of the comparator 47 common to the two unidirectional units is connected to a high potential Vdd, while two reverse inputs 47*b* and 47*c* are respectively connected to input terminals AG1 and AG2 coupled to a power generating unit 1. Hence, if the potential of either the input terminal AG1 or AG2 becomes higher than the high potential Vdd, then the output of the comparator 47 shifts from the high potential to a low potential. In the unidirectional units 30*a* and 30*b*, the input signals of inverters 61 for driving the corresponding rectifying MOSFETs 60*b* and 60*a*, and the output signal of the three-input comparator 47 are applied to the OR circuits 48; when both signals become the low potential, the p-channel MOSFETs 32 are turned ON so as to enable power to be supplied without loss attributable to the forward voltage of diodes. Thus, the comparator commonly used for controlling the unidirectional units 30*a* and 30*b* makes it possible to reduce the total number of comparators, so that the semiconductor device (ASIC) making up the power supply apparatus 20 can be made compact and easier to be built in portable electronic equipment, and the manufacturing cost can be reduced at the same time. Moreover, since the number of comparators can be reduced, the power consumed by the comparators can be reduced accordingly. The power consumed for a set of comparators is approximately 50 nA; in this embodiment, two sets of comparators can be reduced to one set of comparators, so that approximately 50 nA of power can be saved. As previously described, the effect of reducing the power consumption by reducing the number of comparators is extremely important in a low-power system having power consumption of about several hundreds of nanoamps such as a wristwatch.

The rest of the configuration is common to the power supply apparatus 20 which has been explained in conjunction with FIG. 5; therefore, the explanation thereof will be omitted.

Figure 10:
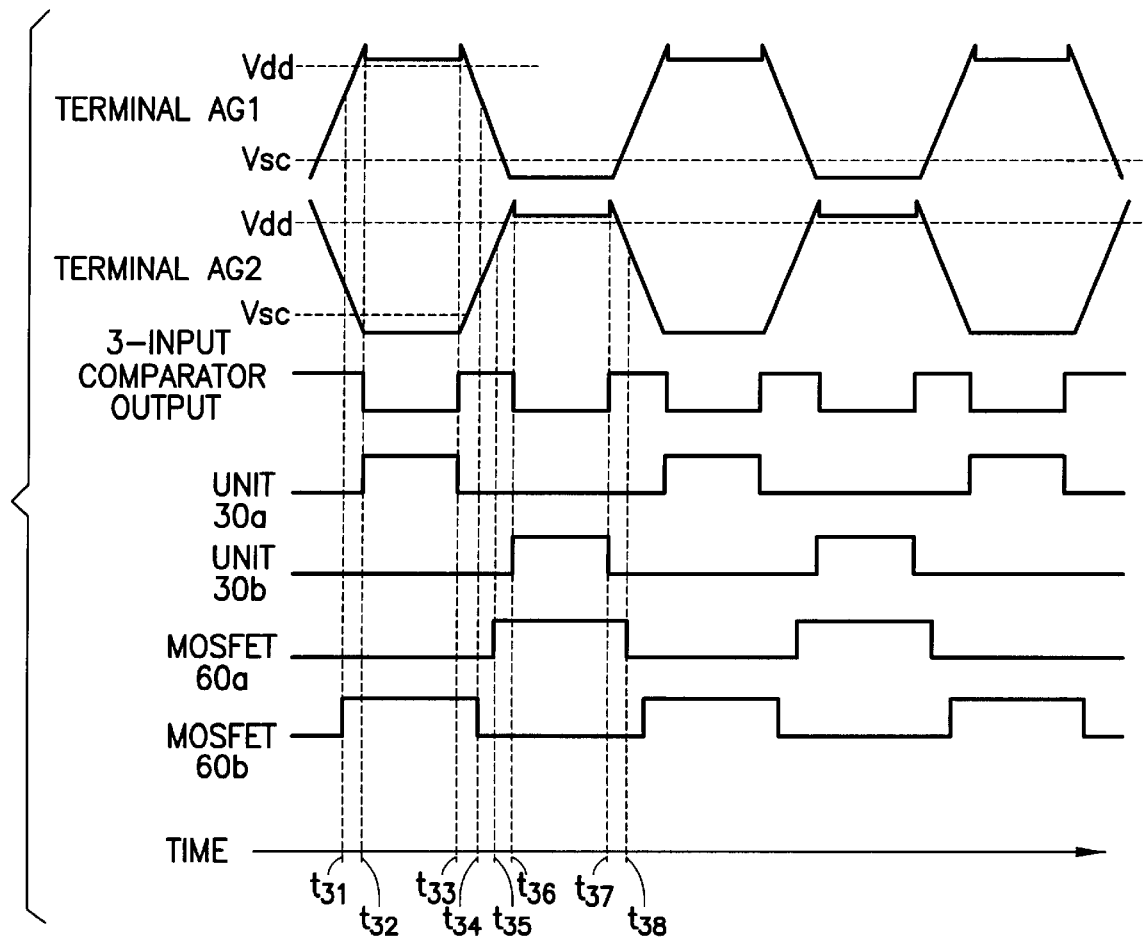
FIG. 10 is a timing chart illustrative of the operation of the power supply apparatus shown in FIG. 9.

Based on the timing chart shown in FIG. 10, the operation of the rectifier circuit 24 of the power supply apparatus 20 of this embodiment will be explained. In the power generating unit 1, when the power generation is begun, and the potential at the input terminal AG1 rises from a low potential Vsc to the high potential Vdd and reaches the threshold values of the MOSFETs 62, which are the driving elements, at time t31, the MOSFETs 62 turn ON. This causes the input sides of the inverters 61 to switch from the high potential to the low potential and the output sides thereof to switch from the low potential to the high potential, turning the rectifying MOSFET 60*b* ON. When the voltage at the input terminal AG1 further rises and exceeds the charging voltage Vdd of the charging unit 5, forward voltage appears at the unidirectional unit 30*a*. Thus, the output of the 3-input comparator 47 switches to the low potential at time t32 and both signals supplied to the OR circuit 48 of the unidirectional unit 30*a* switch to the low potential, so that the p-channel MOSFET 32 turns ON. This allows the unidirectional unit 30*a* to conduct without the loss caused by the forward voltage of the diode, and the power from the power generating unit 1 is supplied to the charging unit 5 or the processing unit 9. The moment the electromotive force in the power generating unit 1 begins to reverse, the voltages at both ends of the MOSFET 32 of the unidirectional unit 30*a* drop at time t33, and the output of the common comparator 47 switches to high level and the MOSFET 32 turns OFF. When the voltage at the input terminal AG1 drops, the voltages lower to the threshold values or less of the MOSFETs 62, which are the driving elements, and the rectifying MOSFET 60*b* also turns OFF at time t34. Hence, the current in the opposite direction no longer flows because of a parasitic diode 34 of the unidirectional unit 30*a* and a parasitic diode 65 of the MOSFET 60*b*.

When the electromotive force of the power generating unit 1 is reversed, the voltage at the input terminal AG2 rises and the rectifying MOSFET 60*a* turns ON at time t35. The output of the common 3-input comparator 47 switches to the low potential at time t36; since the input voltage of the inverter 61 on the side of the MOSFET 60*a* is at the low potential, the output of the OR circuit 38 of the unidirectional unit 30*b* switches to the low potential, and the MOSFET 32 turns ON. Hence, the unidirectional unit 30*b* and the MOSFET 60*a* conduct without the loss attributable to the forward voltage, and power is supplied from the power generating unit 1 to the charging unit 5 and the processing unit 9 with high efficiency. When the voltage at the input terminal AG2 drops, the unidirectional unit 30*b* turns OFF at time t37, and the rectifying MOSFET 60*a* turns OFF at time t38. Thus, no current in the reverse direction no longer flows to the unidirectional unit 30*b* and the MOSFET 60*a*. In this way, the full-wave rectification is carried out, and power is supplied in a state where there is almost no loss caused by the forward voltage of the diodes.

In arm-worn type electronic equipment employing a rotary weight for the power generating unit 1, the comparison in the amount of electric charges of charging has been made between a power supply apparatus wherein the rectifier circuit is constructed using the unidirectional units as described above and a power supply apparatus wherein the rectifier circuit is constructed using Schottky diodes having a smaller Vf than silicon diodes. The comparison result has revealed that: the power supply apparatus employing the unidirectional units provides 1.32-fold electric charges of charging when the movement of the rotary weight is large, namely, when the rotary weight is set up vertically and swung 180 degrees; and it provides 1.71-fold electric charges of charging when the movement of the rotary weight is small, namely, when the rotary weight is set up at 30 degrees and swung 90 degrees. From this result, it can be seen that the use of the unidirectional units greatly improves the rectifying efficiency, and it can be also seen that, when the electromotive force is small, that is, as the movement of the rotary weight is smaller, higher rectifying efficiency can be attained. Accordingly, the portable electronic equipment adopting the power supply apparatus which employs the unidirectional units of this embodiment is able to efficiently feed power even from small movement of an arm, thus permitting portable electronic equipment with high charging capability to be provided.

In the foregoing embodiments, the unidirectional units use p-channel MOSFETs, while the rectifying MOSFETs are n-channel type; it is obviously possible to constitute the power supply apparatus by employing other conductive types.

Thus, according to the present invention, in the power supply apparatus equipped with a power generating unit which can be built in portable electronic equipment, the unidirectional units are employed to implement the rectifying function or the backflow preventing function so as to realize the power supply apparatus with higher power feeding efficiency. In particular, the electromotive force of the power generating unit which can be incorporated in portable electronic equipment is in the vicinity of the forward voltage of a diode, and the electromotive force varies; therefore, the charging capability of the portable electronic equipment can be dramatically improved by eliminating the loss attributable to the forward voltage of the diode in supplying power. Accordingly, the power supply apparatus employing the unidirectional units in accordance with the present invention makes it possible to considerably improve the power supplying capability of the power generating unit employing a solar battery of a thermoelectric device, the power generating performance of which greatly varies depending on environmental conditions, or an electromagnetic power generator or a thermoelectric device which generates AC power by catching the movement of a user thereof by employing a rotary weight or the like, and it also makes it possible to supply sufficient power to charge the charging unit of the portable electronic equipment and to operate the processing unit thereof. The present invention accordingly makes it possible to provide electronic equipment which is capable of continuously operating the processing unit under various environmental conditions and which is suited for carrying; it also makes it possible to provide electronic equipment which enables the function of the processing unit to be fully implemented at any place whenever necessary regardless of the presence of a battery.

Industrial Applicability

The power supply apparatus in accordance with the present invention is suitably used for portable electronic equipment; it is worn on a human body, e.g. on an arm, and it is capable of automatically generating power by catching the movement of the human body to operate the electronic equipment without using a battery or to serve as an auxiliary power supply of the battery.

What is claimed is:

1. A power supply apparatus for supplying power to a portable electronic equipment having a processing unit, comprising:

a charging unit coupled to the processing unit;

an AC power generating unit for generating an AC electrical signal and coupled to said charging unit; and a supply section coupled to said AC power generating unit and having at least one unidirectional unit for full-wave rectifying of said AC electrical signal generated by said AC power generating unit;

said at least one unidirectional unit having a diode, a bypass switch having an ON state and connected in parallel to said diode, and a controller for turning said bypass switch ON when a forward voltage appears across said diode, wherein said controller compares the voltage at both ends of said diode;

wherein said supply section supplies power from said AC power generating unit to one of either said charging unit or the processing unit via said at least one unidirectional unit.

2. The power supply apparatus according to claim 1, wherein said bypass switch is a field-effect transistor and said diode of said at least one unidirectional unit is a parasitic diode of said field-effect transistor.

3. The power supply apparatus according to claim 1, wherein said AC power generating unit outputs an output voltage and said controller is adapted to control said bypass switch at a voltage higher than said AC output voltage of said power generating unit.

4. The power supply apparatus according to claim 1, wherein said bypass switch has an OFF state and said controller turns said bypass switch OFF after a predetermined time has elapsed since said controller has turned said bypass switch to said ON state.

5. The power supply apparatus according to claim 1, wherein said diode has a first end and a second end and a first voltage measured at said first end and a second voltage measured at said second end and said controller has a comparator for comparing said first voltage and said second voltage.

6. The power supply apparatus according to claim 5, wherein said comparator has a detection voltage hysteresis.

7. The power supply apparatus according to claim 1, wherein said bypass switch is an enhancement type field-effect transistor.

8. The power supply apparatus according to claim 7, wherein said diode is a parasitic diode of said field-effect transistor.

9. The power supply apparatus according to claim 1, wherein said power generating unit generates AC power, and said supply section rectifies the AC power via said at least one unidirectional unit and supplies the rectified AC power to at least one of either the charging unit or the processing unit.

10. The power supply apparatus according to claim 9, wherein said supply section has a first input terminal and a second input terminal, said first input terminal and said second input terminal connected to said AC power generating unit; a first output terminal and a second output terminal, said first output terminal and said second output terminal connected to at least one of either said charging unit or the processing unit; a second unidirectional unit, said at least one unidirectional unit being connected to said first input terminal and said second unidirectional unit being connected to said second input terminal, said at least one unidirectional unit and said second unidirectional unit sharing said first output terminal; and a first field-effect transistor and a second field-effect transistor, said first field-effect transistor being connected to said first input terminal and said second field-effect transistor being connected to said second input terminal, said first field-effect transistor and said second field-effect transistor sharing said second output terminal.

11. The power supply apparatus according to claim 10, wherein said second unidirectional unit has a bypass switch and said bypass switch of said at least one unidirectional unit and said bypass switch of said second unidirectional unit are of a first conductive type field-effect transistor having a parasitic diode; said diode of said at least one unidirectional unit being the parasitic diode of said first conductive type field-effect transistor; said first field-effect transistor and said second field-effect transistor being of a second conductive type each having a gate input; and a first voltage at said first input terminal and a second voltage at said second input terminal wherein the voltage at said second input terminal is applied to the gate input of said first field-effect transistor, and the voltage at said first input terminal is applied to the gate input of said second field-effect transistor.

12. The power supply apparatus according to claim 11, wherein a first resistance load element is connected to the gate input of said first field-effect transistor and a second resistance load element is connected to the gate input of said second field-effect transistor.

13. The power supply apparatus according to claim 11, wherein said controller of said at least one unidirectional unit and said second unidirectional unit has a 3-input comparator for comparing the voltages at said first input terminal and second input terminal with the voltage at said first output terminal, said first output terminal being common to said at least one unidirectional unit and second unidirectional unit.

14. The power supply apparatus according to claim 1, wherein said AC power generating unit generates AC power, and said at least one unidirectional unit of said supply section prevents backflow from the charging unit and the processing unit to said power generating unit.

15. Portable electronic equipment comprising:
  a power supply apparatus comprising:
    an AC power generating unit for generating an AC signal;
    a charging unit coupled to said AC power generating unit for accumulating DC power supplied from said AC power generating unit; and
    a supply section coupled to said AC power generating unit and having at least one unidirectional unit for full-wave rectifying of said AC signal generated by said AC power generating unit;
    said at least one unidirectional unit having a diode, a bypass switch having an ON state and connected in parallel to said diode, and a controller for turning said bypass switch ON when a forward voltage appears across said diode; and
  a processing unit coupled to said charging unit, said processing unit using the DC power supplied from said AC power generating unit; and
  wherein said supply section supplies power from said AC power generating unit to one of either said charging unit or the processing unit via said at least one unidirectional unit.

16. A power supply apparatus for supplying power to portable electronic equipment having a processing unit, comprising:

a charging unit coupled to the processing unit;
an AC signal generating unit for generating an AC signal and coupled to said charging unit;
a supply section coupled to said AC signal generating unit and having two unidirectional units to full-wave rectify said AC signal generated by said AC signal generating unit;
each of said two unidirectional units having a diode, a field-effect transistor connected in parallel to said diode, and a comparator for comparing a voltage present across said diode and for turning said transistor on when a forward voltage is present across said diode; and
said supply section supplying power from said AC signal generating unit to one of said charging unit or said processing unit via said two unidirectional units.

17. The power supply apparatus according to claim 16, wherein said diode is a parasitic diode of said field-effect transistor.

18. The power supply apparatus according to claim 16, wherein;
  said AC signal generating unit has a first output terminal and a second output terminal;
  a first one of said two unidirectional units is connected between said first output terminal and a first line of said charging unit;
  a second one of two said unidirectional units is connected between said second output terminal and said first line of said charging unit;
  a first field-effect transistor is connected between said first output terminal and said second line of said charging unit;
  a second field-effect transistor is connected between said second output terminal and said second line of said charging unit; and
  wherein said supply section further comprises a full-wave rectifier bridge circuit constructed by said first said unidirectional unit, said second unidirectional unit, said first field-effect transistor and said second field-effect transistor, and supplies power from said AC signal generating unit to one of said charging unit or said processing unit connected between said first line and said second line.

19. A power supply apparatus for supplying power to a portable electronic equipment having a processing unit, comprising:
  a charging unit coupled to the processing unit;
  an AC power generating unit for generating an AC signal and having a first output terminal and a second output terminal;
  two unidirectional units for full-wave rectifying said AC signal generated by said AC power generating unit;
  each of said two unidirectional units having a diode, a field-effect transistor connected in parallel to said diode, and a comparator for comparing a voltage present across said diode and for turning said transistor on when a forward voltage is across said diode,
  an accumulator having a first terminal connected to said first output terminal of said AC power generating unit;
  a voltage-boosting rectifier circuit comprised of said accumulator and said two unidirectional units;
  a first one of said two unidirectional units being connected between a second terminal of said accumulator and said second terminal of AC power generating unit;

a second one of said two unidirectional units being connected to said second terminal of said accumulator; and said voltage-boosting rectifier circuit supplying power from said AC power generating unit to one of said charging unit or the processing unit.

20. The power supply apparatus according to claim 16 or 19, further comprising a voltage-boosting circuit for boosting a voltage accumulated in said charging unit and wherein said comparator or said processing unit is driven by a boosted voltage by said voltage-boosting circuit.

21. The power supply apparatus according to claim 16 or 19, wherein said comparator turns said field-effect transistor off after a predetermined time has elapsed after said comparator has turned said transistor on.

22. The power supply apparatus according to claim 16 or 19, wherein said comparator has a detection voltage hysteresis.

23. The power supply apparatus according to claim 16 or 19, wherein said comparator has three input terminals.

* * * * *